(12) United States Patent
Park

(10) Patent No.: US 11,481,002 B2
(45) Date of Patent: Oct. 25, 2022

(54) ELECTRONIC DEVICE

(71) Applicant: SAMSUNG DISPLAY CO., LTD., Yongin-si (KR)

(72) Inventor: Changmin Park, Gwangmyeong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/243,990

(22) Filed: Apr. 29, 2021

(65) Prior Publication Data

US 2022/0043485 A1 Feb. 10, 2022

(30) Foreign Application Priority Data

Aug. 10, 2020 (KR) .................. 10-2020-0100098

(51) Int. Cl.
  *G06F 1/16* (2006.01)
  *H05K 5/04* (2006.01)
  *H04M 1/02* (2006.01)

(52) U.S. Cl.
  CPC .......... *G06F 1/1652* (2013.01); *G06F 1/1616* (2013.01); *H05K 5/04* (2013.01); *H04M 1/0268* (2013.01)

(58) Field of Classification Search
  CPC .... G06F 1/1652; G06F 1/1616; G06F 1/1641; G06F 1/203; H05K 5/04
  See application file for complete search history.

(56) References Cited

U.S. PATENT DOCUMENTS

| | | | |
|---|---|---|---|
| 8,947,627 B2* | 2/2015 | Rappoport | G06F 1/1686 349/149 |
| 9,269,748 B2 | 2/2016 | Liu et al. | |
| 9,392,706 B2* | 7/2016 | Yoo | H03K 17/941 |
| 9,971,448 B2 | 5/2018 | Franklin et al. | |
| 10,230,062 B2 | 3/2019 | Kim et al. | |
| 10,728,371 B2* | 7/2020 | Kwon | G06F 1/1686 |
| 2014/0267990 A1* | 9/2014 | Moon | G06F 1/1605 349/122 |
| 2017/0289324 A1* | 10/2017 | Yeo | H04M 1/0277 |
| 2017/0300736 A1* | 10/2017 | Song | G06V 40/1312 |
| 2018/0255219 A1* | 9/2018 | Ramaprakash | G02B 26/007 |
| 2019/0213924 A1 | 7/2019 | Ha et al. | |
| 2019/0305237 A1* | 10/2019 | Shin | H01L 27/323 |
| 2020/0147932 A1 | 5/2020 | Baby et al. | |
| 2020/0266845 A1* | 8/2020 | Kumar | G06F 1/1637 |
| 2020/0273934 A1* | 8/2020 | You | G06F 3/041 |

FOREIGN PATENT DOCUMENTS

| | | |
|---|---|---|
| KR | 10-2018-0006530 | 1/2018 |
| KR | 10-2019-0085208 | 7/2019 |
| KR | 10-2020-0016927 | 2/2020 |
| KR | 10-2151778 | 9/2020 |

* cited by examiner

*Primary Examiner* — Abhishek M Rathod
(74) *Attorney, Agent, or Firm* — F. Chau & Associates, LLC

(57) ABSTRACT

An electronic device includes a support under a display panel. The display panel includes a first area, a second area, and a third area. The third area is spaced from the first area, and the second area is between the first area and the second area. The electronic device also includes an electronic module spaced from the display panel, with the support therebetween and overlapping the third area. The support includes first and second supports. The second support is on the first support and includes a first opening overlapping the electronic module.

19 Claims, 12 Drawing Sheets

ELECTRONIC DEVICE

CROSS-REFERENCE TO RELATED APPLICATION

This U.S. non-provisional patent application claims priority under 35 U.S.C. § 119 of Korean Patent Application No. 10-2020-0100098, filed on Aug. 10, 2020, the contents of which are hereby incorporated by reference in its entirety.

BACKGROUND

1. Field of Disclosure

One or more embodiments described herein relate to a foldable electronic device.

2. Description of the Related Art

Various types of electronic devices include displays. Some typical examples include smartphones, digital cameras, notebook computers, navigation units, and smart televisions. These displays may present images, video, and other content to their users. Some of the displays in these electronic devices are not flexible and therefore present problems during many instances of use.

SUMMARY

In accordance with one or more embodiments, an electronic device is provided with improved reliability.

In accordance with one or more embodiments, an electronic device includes a display panel comprising a first area, a second area adjacent to the first area in a first direction, and a third area spaced apart from the first area in the first direction, the second area interposed between the first area and the second area; a support disposed under the display panel; and an electronic module spaced apart from the display panel with the support interposed therebetween and overlapping the third area. The support comprise a first support comprising a first surface and a second surface facing the first surface; and a second support disposed on the first surface of the first support, wherein the second support includes a first opening overlapping the electronic module.

In accordance with one or more embodiments, an electronic device includes a display panel comprising a folding area and a non-folding area, the folding area configured to fold about a folding axis and the non-folding area adjacent to the folding area; and a support disposed under the display panel and comprising: a first support comprising a first surface and a second surface facing the first surface; and a second support disposed on the first surface of the first support, wherein the second support includes a first opening therethrough and overlapping the non-folding area, the first support comprising a protruding portion disposed in the first opening.

In accordance with one or more embodiments, an apparatus includes a support coupled to a display panel and including: a first support layer including a first material; and a second support layer coupled to the first support and including a second material, wherein the first material includes a metal or a metal alloy and the second material includes plastic and wherein a total weight of the second support layer is less than a total weight of the first support layer.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

Figure 1A:
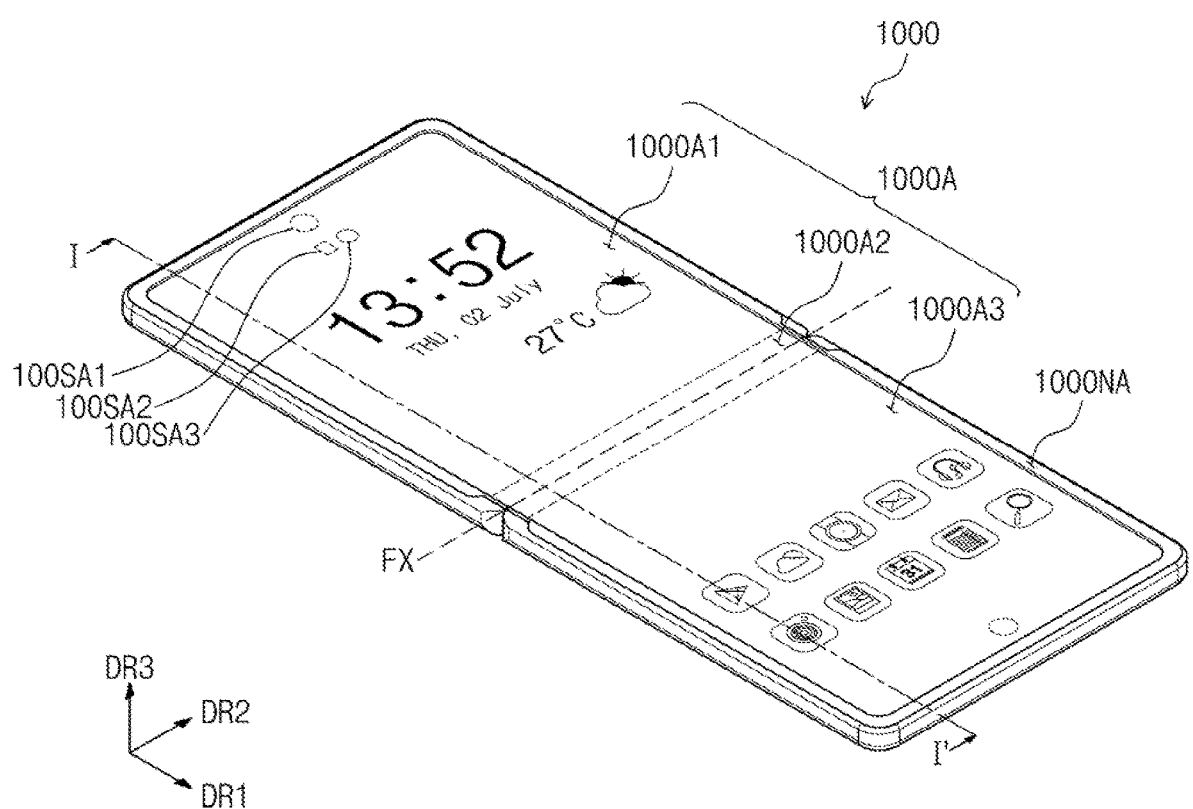
FIGS. 1A and 1B illustrate an embodiment of an electronic device.

In accordance with one or more embodiments, it will be understood that when an element or layer is referred to as being "on", "connected to" or "coupled to" another element or layer, it can be directly on, connected or coupled to the other element or layer or intervening elements or layers may be present. Like numerals refer to like elements throughout. In the drawings, the thickness, ratio, and dimension of components are exaggerated for effective description of the technical content. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the embodiments.

As used herein, the singular forms, "a", "an" and "the" are intended to include plural forms as well unless the context clearly indicates otherwise. Spatially relative terms, such as "beneath", "below", "lower", "above", "upper" and the like, may be used herein for ease of description to describe one element or feature's relationship to another element(s) or feature(s) as illustrated in the figures. In accordance with one or more embodiments, In accordance with one or more embodiments, the terms "unit," "support" and/or "layer" may be considered synonymous, and are not intended to be interpreted as means-plus-function language.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Figure 1B:
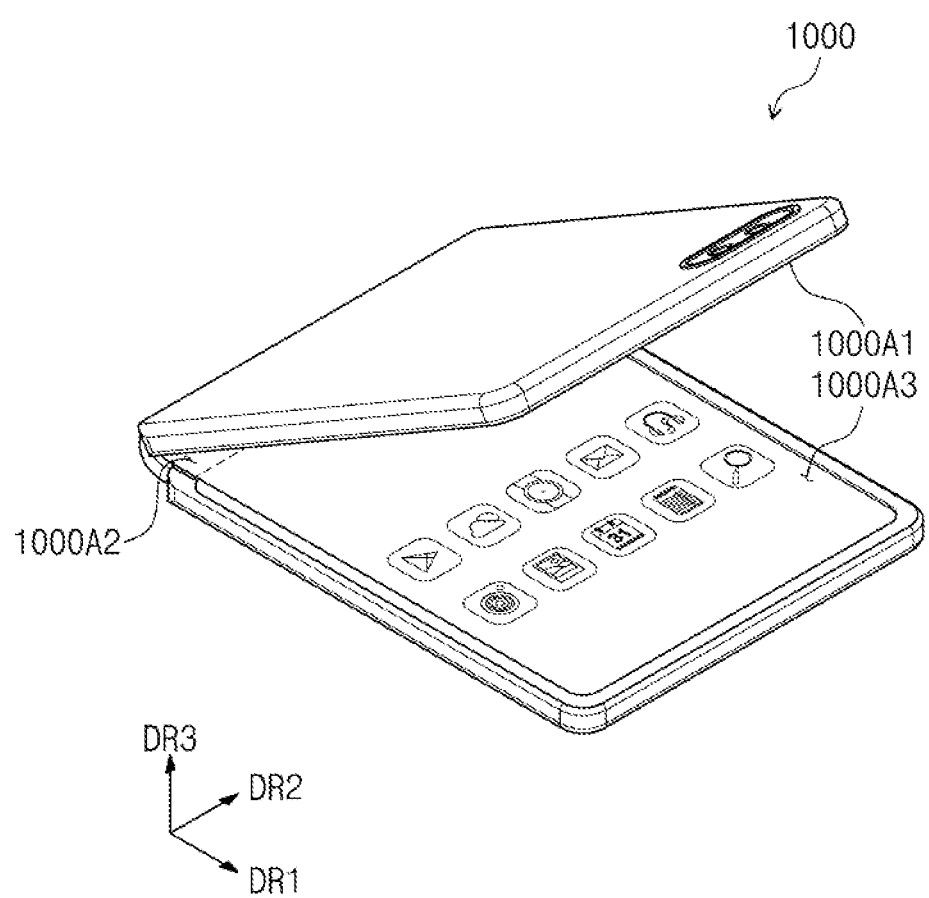

FIGS. 1A and 1B are perspective views of an electronic device 1000 according to an exemplary embodiment. In particular, FIG. 1A shows the electronic device 1000 in an unfolded state, and FIG. 1B shows the electronic device 1000 in a folded state.

Referring to FIGS. 1A and 1B, the electronic device 1000 may be a device that is activated in response to electrical signals. Examples of the electronic device 1000 include, but are not limited to, a mobile phone, a tablet computer, a car navigation unit, a game unit, or a wearable device. FIG. 1A shows the mobile phone as a representative example of the electronic device 1000.

The electronic device 1000 may display images through an active area 1000A. The active area 1000A may include a plane defined by a first direction DR1 and a second direction DR2 in an unfolded state of the electronic device 1000. A thickness direction of the electronic device 1000 may be substantially parallel to a third direction DR3 crossing the first direction DR1 and the second direction DR2. Accordingly, front (or upper) and rear (or lower) surfaces of each member of the electronic device 1000 may be defined relative to third direction DR3.

The active area 1000A may include a first area 1000A1, a second area 1000A2, and a third area 1000A3. The second area 1000A2 may be folded about a folding axis FX extending in the second direction DR2. Thus, first area 1000A1 and third area 1000A3 may be referred to as non-folding areas, and second area 1000A2 may be referred to as a folding area.

When the electronic device 1000 is folded, the first area 1000A1 and the third area 1000A3 may face each other. When the electronic device 1000 is fully folded, the active area 1000A may not be externally visible, and this folding state may be referred to as an in-folding. However, this is merely exemplary, and an operation of the electronic device 1000 should not be limited thereto or thereby. According to an exemplary embodiment, when the electronic device 1000 is folded, the first area 1000A1 and the third area 1000A3 may face in opposite directions. Accordingly, the active area 1000A may be exposed to the outside in the folded state, and this folding state may be referred to as an out-folding.

In one embodiment, the electronic device 1000 may perform only one of the in-folding or out-folding operations. In one embodiment, the electronic device 1000 may perform both the in-folding and the out-folding operations. In this case, the second area 1000A2 of the electronic device 1000 may be inwardly folded (in-folding) or outwardly folded (out-folding). In one embodiment, one portion of the electronic device 1000 may be inwardly folded (in-folding), and the other portion of the electronic device 1000 may be outwardly folded (out-folding).

FIGS. 1A and 1B show one folding area and two non-folding areas as a representative example. A different number of folding areas and/or non-folding areas may be provided in another embodiment. For example, electronic device 1000 may include three or more non-folding areas and a plurality of folding areas between the non-folding areas adjacent to each other.

FIGS. 1A and 1B show that the folding axis FX is substantially parallel to a short axis of the electronic device 1000. In one embodiment, the folding axis FX may extend to be substantially parallel to another axis, e.g., a long axis of the electronic device 1000 such as, but not limited to, a direction substantially parallel to the first direction DR1. In this case, the first area 1000A1, the second area 1000A2, and the third area 1000A3 may be sequentially arranged in the second direction DR2.

The electronic device 1000 may include a plurality of sensing areas 100SA1, 100SA2, and 100SA3. FIG. 1A shows three sensing areas 100SA1, 100SA2, and 100SA3 as a representative example. However, the number of the sensing areas 100SA1, 100SA2, and 100SA3 should not be limited to three. Also, FIG. 1A shows the sensing areas 100SA1, 100SA2, and 100SA3 disposed in the first area 1000A1. However, the area in which the sensing areas 100SA1, 100SA2, and 100SA3 are disposed should not be limited thereto or thereby. For example, the sensing areas 100SA1, 100SA2, and 100SA3 may be disposed in the third area 1000A3.

The sensing areas 100SA1, 100SA2, and 100SA3 may include a first sensing area 100SA1, a second sensing area 100SA2, and a third sensing area 100SA3. For example, the first sensing area 100SA1 may overlap a camera module, and the second sensing area 100SA2 and the third sensing area 100SA3 may overlap a proximity illumination sensor. However, all or a portion of these sensing areas may be at different locations in another embodiment.

Some electronic modules of a plurality of electronic modules 900 (e.g., refer to FIG. 3) may receive an external input through the first sensing area 100SA1, the second sensing area 100SA2 or the third sensing area 100SA3, or may provide an output through the first sensing area 100SA1, the second sensing area 100SA2 or the third sensing area 100SA3.

The first sensing area 100SA1 may be surrounded by the active area 1000A. The second sensing area 100SA2 and the third sensing area 100SA3 may be in the active area 1000A. For example, the second sensing area 100SA2 and the third sensing area 100SA3 may display an image. Each of the first sensing area 100SA1, the second sensing area 100SA2, and the third sensing area 100SA3 may have a transmittance greater than a transmittance of the active area 1000A. In addition, the first sensing area 100SA1 may have the transmittance greater than the transmittance of each of the second sensing area 100SA2 and the transmittance of the third sensing area 100SA3.

According to the exemplary embodiment, some electronic modules among the electronic modules 900 (e.g., refer to FIG. 3) may overlap the active area 1000A. Other electronic modules among the electronic modules 900 (e.g., refer to FIG. 3) may be surrounded by the active area 1000A. Accordingly, an area may not be provided for the arrangement of electronic modules 900 (e.g., refer to FIG. 3) in a peripheral area 1000NA around the active area 1000A. As a result, the ratio of a size of the active area 1000A to a front surface of the electronic device 1000 may increase.

Figure 2A:
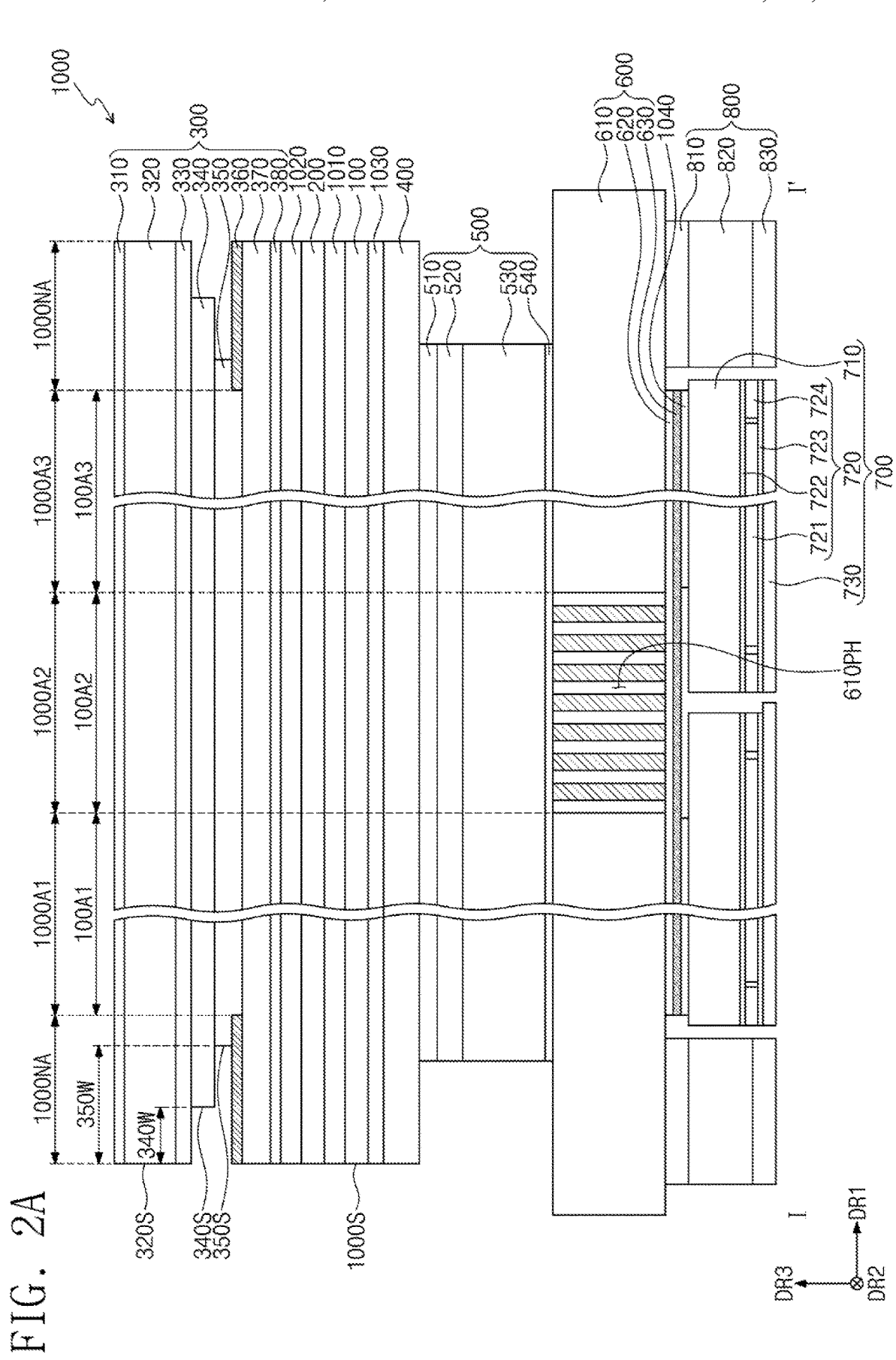
FIG. 2A illustrates a view taken along a line I-I' of FIG. 1A.
Figure 2B:
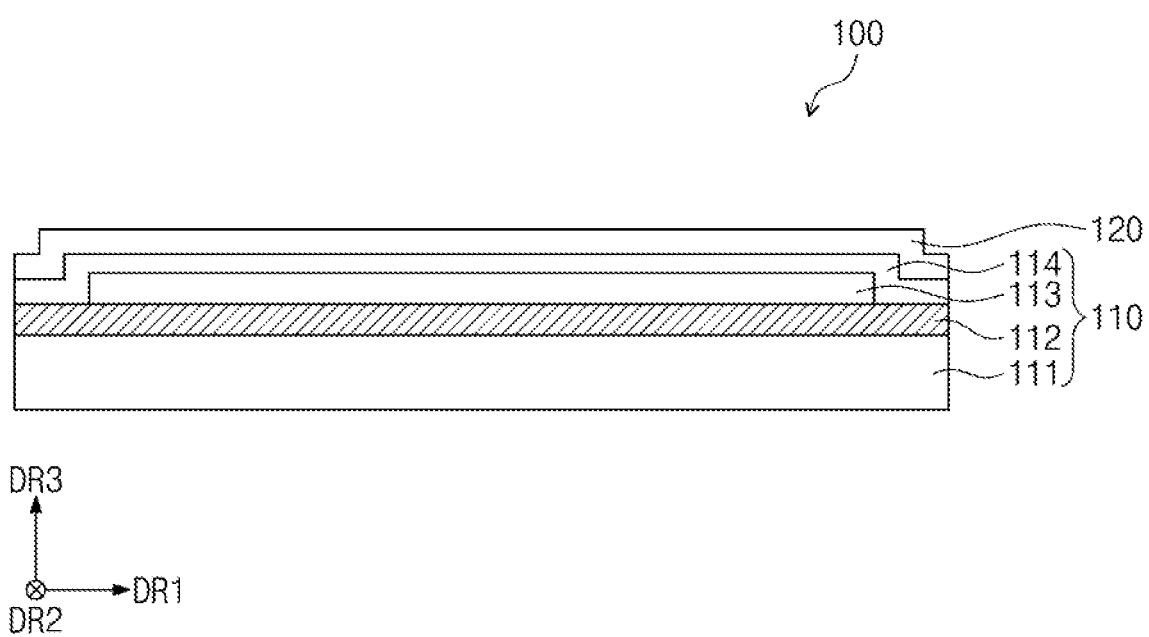
FIG. 2B illustrates an embodiment of a display panel.

FIG. 2A is a cross-sectional view taken along a line I-I' of FIG. 1A to show the electronic device 1000 according to an exemplary embodiment, and FIG. 2B is a cross-sectional view showing a display panel 100 according to an exemplary embodiment.

Referring to FIG. 2A, the electronic device 1000 may include the display panel 100, upper functional layers, and lower functional layers. The upper functional layers refer to layers disposed on the display panel 100, and the lower functional layers refer to layers disposed under the display panel 100.

The display panel includes a first area 100A1, a second area 100A2, and a third area 100A3. The first area 100A1 may overlap the first area 1000A1 of the electronic device 1000. The second area 100A2 may be disposed next to the first area 100A1 in the first direction DR1 and may overlap the second area 1000A2 of the electronic device 1000. The third area 100A3 may be spaced apart from the first area 100A1 in the first direction DR1, with the second area 100A2 interposed therebetween. The third area 100A3 may overlap the third area 1000A3 of the electronic device 1000.

Referring to FIG. 2B, the display panel 100 may generate images and sense external inputs applied thereto. For example, the display panel 100 may include a display layer 110 and a sensor layer 120. The display panel 100 may have a thickness, for example, from about 25 micrometers to about 35 micrometers, e.g., about 30 micrometers. The thickness of the display panel 100 may be different in another embodiment. The display panel 100 may include at least one folding area. The folding area of the display panel 100 may be referred to as the second area 100A2.

The display layer 110 may include a configuration that substantially generates images. For example, the display layer 110 may be a light emitting type display layer. Examples include an organic light emitting display layer, a quantum dot display layer, a micro-LED display layer, and a nano-LED display layer.

The display layer 110 may include a base layer 111, a circuit layer 112, a light emitting element layer 113, and an encapsulation layer 114. The base layer 111 may include a synthetic resin layer. The synthetic resin layer may include, for example, a heat-curable resin. The base layer 111 may have a multi-layer structure. For instance, the base layer 111 may have a first synthetic resin layer, a silicon oxide (SiOx) layer disposed on the first synthetic resin layer, an amorphous silicon (a-Si) layer disposed on the silicon oxide layer, and a second synthetic resin layer disposed on the amorphous silicon layer. Each of the silicon oxide layer and the amorphous silicon layer may be referred to as a "base barrier layer." In one embodiment, one or more of the first and second the synthetic resin layers may be polyimide-based resin layers.

In addition, each of the first and second synthetic resin layers may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, or a perylene-based resin. Meanwhile, in one embodiment, an element includes "A"-based resin may indicate that it contains a functional group of "A". The base layer 111 may include a glass substrate or an organic/inorganic composite substrate.

The circuit layer 112 may be disposed on the base layer 111 and, for example, may include an insulating layer, a semiconductor pattern, a conductive pattern, and a signal line. An insulating layer, a semiconductor layer, and a conductive layer may be formed on the base layer 111, for example, by a coating or depositing process. Then, the insulating layer, the semiconductor layer, and the conductive layer may be selectively patterned by a plurality of photolithography processes to form the semiconductor pattern, the conductive pattern, and the signal line in the circuit layer 112.

The light emitting element layer 113 may be disposed on the circuit layer 112 and may include a light emitting element. For example, the light emitting element layer 113 may include an organic light emitting material, a quantum dot, a quantum rod, a micro-LED, or a nano-LED.

The encapsulation layer 114 may be disposed on the light emitting element layer 113 and, for example, may include an inorganic layer, an organic layer, and an inorganic layer which are sequentially stacked. The encapsulation layer 114 may include a different number of type of layers in another embodiment.

The inorganic layers may protect the light emitting element layer 113 from moisture and oxygen. The organic layer may protect the light emitting element layer 113 from a foreign substance such as dust particles. The inorganic layers may include, for example, a silicon nitride layer, a silicon oxynitride layer, a silicon oxide layer, a titanium oxide layer, or an aluminum oxide layer. The organic layer may include an acrylate-based organic layer, but may include a different type of material or layer in another embodiment.

The sensor layer 120 may be disposed on the display layer 110 and may sense an externally applied input. The external input may be a user input created, for example, by contact with a part of user's body (e.g., finger), light, heat, pen, or pressure. The sensor layer 120 may be formed on the display layer 110 through successive processes. In one embodiment, the sensor layer 120 may be disposed directly on the display layer 110 using these processes. The expression that a component "B" is disposed directly on a component "A" may indicate that no intervening elements are present between the component "B" and the component "A," e.g., a separate adhesive member may not be disposed between the sensor layer 120 and the display layer 110. In one embodiment, the sensor layer 120 may be combined with the display layer 110 by an adhesive member. The adhesive member may include, for example, an ordinary or predetermined type of adhesive.

Referring to FIG. 2A again, the upper functional layers may be disposed on the display panel 100 and may include, for example, an anti-reflective member 200 and an upper member 300. The anti-reflective member 200 may be referred to as an anti-reflective layer, which may reduce reflectance of external light. In one embodiment, the anti-reflective member 200 may include a stretch-type synthetic resin film. The anti-reflective member 200 may be provided, for example, by dyeing a polyvinyl alcohol film (PVA film) with an iodine compound. The anti-reflective member 200 may be provided in another way or using another material in a different embodiment. The anti-reflective member 200 may have a thickness from about 25 micrometers to about 35 micrometers, e.g., about 31 micrometers. The thickness of the anti-reflective member 200 may lie in a different range in another embodiment.

The anti-reflective member 200 may be coupled to the display panel 100 by a first adhesive layer 1010. The first adhesive layer 1010 may be a transparent adhesive layer. Examples include a pressure sensitive adhesive (PSA) film, an optically clear adhesive (OCA) film, and an optically clear resin (OCR). In one embodiment, the first adhesive layer 1010 may have a thickness from about 20 micrometers to about 30 micrometers (e.g., about 25 micrometers), but may have a different thickness in another embodiment. In one embodiment, the first adhesive layer 1010 may be omitted. In this case, the anti-reflective member 200 may be disposed directly on the display panel 100. In this case, a separate adhesive layer may not be disposed between the anti-reflective member 200 and the display panel 100.

The upper member 300 may be disposed on the anti-reflective member 200 and may include a first hard coating layer 310, a protective layer 320, a first upper adhesive layer 330, a window 340, a second upper adhesive layer 350, a light blocking layer 360, an impact absorbing layer 370, and a second hard coating layer 380. Components included in the upper member 300 should not be limited thereto or thereby. At least some components among the above-mentioned components may be omitted and other components may be added.

The first hard coating layer 310 may be disposed at an outermost surface of the electronic device 1000. For example, the first hard coating layer 310 may be coated on the protective layer 320 as a functional layer that improves characteristics of use of the electronic device 1000. In one embodiment, the first hard coating layer 310 may improve anti-fingerprint characteristics, anti-pollution characteristics, scratch-resistant characteristics, and the like.

The protective layer 320 may be disposed under the first hard coating layer 310 to protect components thereunder. The first hard coating layer 310 and the anti-fingerprint layer may be additionally provided on the protective layer 320, for example, in order to improve properties such as chemical resistance and abrasion resistance. The protective layer 320 may include a film having an elastic modulus equal to or less than about 15 GPa at room temperature. The protective layer 320 may have a thickness from about 50 micrometers to about 60 micrometers (e.g., about 55 micrometers), but may have a different thickness in another embodiment. According to one exemplary embodiment, protective layer 320 may be omitted.

The first upper adhesive layer 330 may be disposed under the protective layer 320 and may be coupled to the window 340 by the first upper adhesive layer 330. The first upper adhesive layer 330 may have a thickness from about 20 micrometers to about 30 micrometers (e.g., about 25 micrometers), but may have a different thickness in another embodiment.

The window 340 may be disposed under the first upper adhesive layer 330 and may include an optically transparent insulating material. For example, the window 340 may include a glass substrate or a synthetic resin film. When the window 340 includes a glass substrate, the window 340 may have a thickness equal to or less than about 80 micrometers (e.g., about 30 micrometers), but may have a different thickness in another embodiment.

When the window 340 is the synthetic resin film, the window 340 may include a polyimide (PI) film or a polyethylene terephthalate (PET) film. The window 340 may have a single-layer or multi-layer structure. For example, the window 340 may include a plurality of synthetic resin films coupled to each other by an adhesive or the glass substrate and the synthetic resin film coupled to the glass substrate by the adhesive.

The second upper adhesive layer 350 may be disposed under the window 340. The window 340 may be coupled to the impact absorbing layer 370 by the second upper adhesive layer 350. The second upper adhesive layer 350 may have a thickness from about 30 micrometers to about 40 micrometers (e.g., about 35 micrometers), but may have a different thickness in another embodiment.

According to an exemplary embodiment, a sidewall 340S of the window 340 and a sidewall 350S of the second upper adhesive layer 350 may be disposed at an inner side than sidewalls of other layers, e.g., a sidewall 100S of the display panel 100 and a sidewall 320S of the protective layer 320. In one embodiment, the expression "component A is disposed at an inner side than component B" may indicate that component A is closer to the active area 1000A than component B.

A positional relationship between the layers may be changed by the folding operation of the electronic device 1000. According to one exemplary embodiment, since the sidewall 340S of the window 340 is disposed at the inner side than the sidewall 100S of the display panel 100 and the sidewall 320S of the protective layer 320, a probability that the sidewall 340S of the window 340 protrudes more than the sidewall 320S of the protective layer 320 may be reduced, even though the positional relationship between the layers is changed. Accordingly, a probability that external impact is transferred through the sidewall 340S of the window 340 may be reduced, and accordingly the occurrence of a crack forming in the window 340 may be reduced.

A first distance 340W between the sidewall 340S of the window 340 and the sidewall 320S of the protective layer 320 may be equal to or greater than a predetermined distance. In the present exemplary embodiment, the first distance 340W may be a distance in a direction that is substantially parallel to the first direction DR1. In addition, the first distance 340W may correspond to a distance between sidewall 340S and sidewall 320S when viewed in a plane.

The first distance 340W may be in a range from about 180 micrometers to about 205 micrometers (e.g., about 196 micrometers), but may be in a different range in another embodiment. For example, the first distance 340W may be equal to or greater than about 50 micrometers and may be about 300 micrometers. As the first distance 340W increases, the protective layer 320 may protrude more than the window 340 and a portion of the protective layer 320 may be bent to be attached to other components, e.g., a case. In addition, as the area of the protective layer 320 increases, the probability may be reduced that a foreign substance from an upper portion of protective layer 320 enters a lower portion of protective layer 320.

In addition, the window 340 and the second upper adhesive layer 350 may be attached to the impact absorbing layer 370 through a lamination process. In consideration of a tolerance of the lamination process, an area of each of the window 340 and the second upper adhesive layer 350 may be less than an area of the impact absorbing layer 370. In addition, the area of the second upper adhesive layer 350 may be less than the area of the window 340. For example, a pressure may be applied to the second upper adhesive layer 350 during a process of attaching the window 340. The second upper adhesive layer 350 may be elongated in a direction substantially parallel to the first direction DR1 and the second direction DR2 due to the pressure applied thereto. In this case, the area of the second upper adhesive layer 350 may be less than the area of the window 340, to reduce an extent to which the second upper adhesive layer 350 may protrude more than the window 340.

In a case where the first upper adhesive layer 330 is attached to the second upper adhesive layer 350, a buckling phenomenon may occur on the window 340, since the window 340 does not slip during the folding operation of the electronic device 1000. However, according to an exemplary embodiment, the area of the second upper adhesive layer 350 may be less than the area of the window 340. Accordingly, the first upper adhesive layer 330 may not be attached to the second upper adhesive layer 350, and a probability may be reduced that the foreign substance is adhered to the second upper adhesive layer 350.

A second distance 350W between the sidewall 350S of the second upper adhesive layer 350 and the sidewall 320S of the protective layer 320 may be equal to or greater than a predetermined distance. In an exemplary embodiment, the second distance 350W may be a distance in a direction that is substantially parallel to the first direction DR1. In addition, the second distance 350W may correspond to a distance between the sidewall 350S and the sidewall 320S, when viewed in a plane.

In one example, the second distance 350W may be about 392 micrometers, but may be a different distance in another embodiment. For example, in one case, the second distance 350W may be in a range from about 292 micrometers to about 492 micrometers.

The impact absorbing layer 370 may be a functional layer to protect the display panel 100 from external impact. The impact absorbing layer 370 may include one or more films having an elastic modulus equal to or greater than about 1 GPa at room temperature. In one embodiment, the impact absorbing layer 370 may include a stretch film with an optical function. For example, the impact absorbing layer 370 may be an optical axis control film having an optical axis that is controlled. For example, the impact absorbing layer 370 may be a PET film that is biaxially stretched. The impact absorbing layer 370 may have a thickness from about 35 micrometers to about 45 micrometers (e.g., about 41 micrometers), but may have a different thickness in another embodiment. In one exemplary embodiment, the impact absorbing layer 370 may be omitted.

The second hard coating layer 380 may be disposed on a surface of the impact absorbing layer 370. The second hard coating layer 380 may include an organic coating agent, an inorganic coating agent, or an organic/inorganic mixed coating agent. In one embodiment, the second hard coating layer 380 may include a material that decreases haze. In one embodiment, haze may indicate by a degree of diffusion of light incident to a test object. High haze may correspond to a cause where light is scattered to a greater extent, resulting in less clear and opaque state.

The impact absorbing layer 370 may include uneven upper and lower surfaces. The upper surface of the impact absorbing layer 370 may be in contact with the second upper adhesive layer 350. The uneven surface of the upper surface of the impact absorbing layer 370 may be filled with the second upper adhesive layer 350. Accordingly, optical issues (e.g., increase of haze) may not occur on the upper surface of the impact absorbing layer 370. The lower surface of the impact absorbing layer 370 may be planarized by the second hard coating layer 380.

The light blocking layer 360 may be between the impact absorbing layer 370 and the second upper adhesive layer 350. In one embodiment, the light blocking layer 360 may be printed on the upper surface of the impact absorbing layer 370. The light blocking layer 360 may overlap the peripheral area 1000NA and, for example, may be a colored layer formed by a coating method. The light blocking layer 360 may include, for example, a polymer resin and a pigment mixed with the polymer resin. The polymer resin may be an acrylate-based resin, a polyester or another material, and the pigment may be, for example, a carbon-based pigment. The light blocking layer 360 may include one or more different materials in another embodiment.

The light blocking layer 360 may be printed on the impact absorbing layer 370 after the second hard coating layer 380 is formed. Since the impact absorbing layer 370 has a more uneven surface than the second hard coating layer 380, when the light blocking layer 360 is printed on the impact absorbing layer 370, adhesion may be higher than that when the light blocking layer 360 is printed on the second hard coating layer 380. For example, as the light blocking layer 360 is printed directly on the uneven surface of the impact absorbing layer 370, a phenomenon that the light blocking layer 360 is separated from the impact absorbing layer 370 may be reduced. When the probability that the light blocking layer 360 becomes separated from a print target surface (e.g., the impact absorbing layer 370) is reduced, product reliability of the electronic device 1000 may be improved.

The upper member 300 may be coupled to the anti-reflective member 200 by a second adhesive layer 1020. The second adhesive layer 1020 may include one or more adhesives. The second adhesive layer 1020 may have a thickness from about 20 micrometers to about 30 micrometers (e.g., about 25 micrometers), but the thickness of the second adhesive layer 1020 may lie in a different range in another embodiment.

The lower functional layers may be disposed under the display panel 100 and, for example, may include a lower protective film 400, a cushion member 500, a first lower member 600, a second lower member 700, and a step difference compensation member 800. The number, type, and/or materials of the components in the lower functional layers may be different in another embodiment. In one embodiment, one or more of the above-mentioned components may be omitted or other components may be added in the lower functional layers.

The lower protective film 400 may be coupled to a rear surface of the display panel 100 by a third adhesive layer 1030. The lower protective film 400 may prevent scratches from occurring on the rear surface of the display panel 100 during a manufacturing process of the display panel 100. The lower protective film 400 may be, for example, a colored polyimide film, e.g., an opaque yellow film. The lower protective film 400 may include one or more other materials in a different embodiment.

The cushion member 500 may be disposed under the lower protective film 400 and may protect the display panel 100 from impact from a lower side of the cushion member 500. The impact resistance of the electronic device 1000 may therefore be improved by the cushion member 500.

The cushion member 500 may include a first cushion adhesive layer 510, a barrier film 520, a cushion layer 530, and a second cushion adhesive layer 540. One or more of the aforementioned components may be omitted and/or one or more other components may be added to the cushion member 500.

The first cushion adhesive layer 510 and the second cushion adhesive layer 540 may include an adhesive. The first cushion adhesive layer 510 may be attached to the lower protective film 400, and the second cushion adhesive layer 540 may be attached to the first lower member 600. The first cushion adhesive layer 510 may have a thickness from about 20 micrometers to about 30 micrometers (e.g., about 25 micrometers), and the second cushion adhesive layer 540 may have a thickness from about 4 micrometers to about 15 micrometers (e.g., about 8 micrometers). The thickness of the first cushion adhesive layer 510 and/or the thickness of the second cushion adhesive layer 540 may be different in another embodiment.

The barrier film 520 may be provided to improve impact resistance. The barrier film 520 may also prevent the display panel 100 from being deformed. In one embodiment, the barrier film 520 may include a synthetic resin film (e.g., a polyimide film) and/or other material. The barrier film 520 may have a thickness from about 30 micrometers to about 40 micrometers (e.g., about 35 micrometers), but may have a different thickness in another embodiment.

The cushion layer 530 may include, for example, foam or a sponge. The foam may include, for example, a polyurethane foam or a thermoplastic polyurethane foam. When the cushion layer 530 includes foam, the cushion layer 530 may be formed using the barrier film 520 as a base layer. For example, the cushion layer 530 may be formed by providing a foaming agent on the barrier film 520. The cushion layer 530 may have a thickness from about 80 micrometers to about 120 micrometers (e.g., about 100 micrometers), but may have a different thickness in another embodiment.

At least one of the barrier film 520 and the cushion layer 530 may have a color that absorbs light. For example, at least one of the barrier film 520 and the cushion layer 530 may have a black color. In this case, components disposed under the cushion member 500 may be prevented from being externally visible.

The first lower member 600 may be disposed under the cushion member 500 and may include a support unit 610, a lower adhesive layer 620, and a cover layer 630. One or more of the above-mentioned components may be omitted and/or one or more other components may be added to the first lower member 600 in other embodiments.

The support unit 610 may include a material having, for example, an elastic modulus equal to or greater than about 60 GPa at room temperature. The support unit 610 may support components disposed thereon. In addition, heat dissipation performance of the electronic device 1000 may be improved by the support unit 610.

In one embodiment, the support unit 610 may be provided with a pattern hole 610PH in or through a portion thereof. The pattern hole 610PH may overlap the second area 100A2 of the display panel 100. When viewed in a plane (e.g., when viewed in the third direction DR3), the pattern hole 610PH may overlap the second area 100A2 of the display panel 100. The pattern hole 610PH may also overlap the second area 1000A2. The shape of a portion of the support unit 610 may be easily changed or be different due to the pattern hole 610PH.

The cover layer 630 may be attached to the support unit 610 by the lower adhesive layer 620. The lower adhesive layer 620 may include an adhesive, and the cover layer 630 may cover the pattern hole 610PH of the support unit 610. Accordingly, it is possible to prevent a foreign substance from entering the pattern hole 610PH.

The cover layer 630 may include a material having an elastic modulus which, for example, is less than the elastic modulus of the support unit 610. In one embodiment, the cover layer 630 may include a thermoplastic polyurethane, but may include a different material in another embodiment.

The lower adhesive layer 620 may have a thickness from about 4 micrometers to about 15 micrometers (e.g., about 8 micrometers). The cover layer 630 may have a thickness from about 4 micrometers to about 15 micrometers (e.g., about 8 micrometers). The thickness of the lower adhesive layer 620 and/or the cover layer 630 may be different in other embodiments.

The second lower members 700 may be disposed under the first lower member 600 and, for example, may be disposed to be spaced apart from each other. In one embodiment, one second lower member 700 may be in the first area 100A1 of the display panel 100, and the other second lower member 700 may be in the third area 100A3 of the display panel 100.

Each of the second lower members 700 may be attached to the first lower member 600 by fourth adhesive layers 1040. For example, one fourth adhesive layer 1040 may be attached to a lower surface of the first lower member 600 overlapping the first area 100A1 of the display panel 100. The other fourth adhesive layer 1040 may be attached to a lower surface of the first lower member 600 overlapping the third area 100A3 of the display panel 100. In one embodiment, the fourth adhesive layers 1040 may not overlap the second area 100A2 of the display panel 100. Each of the fourth adhesive layers 1040 may have a thickness from about 8 micrometers to about 15 micrometers (e.g., about 8 micrometers), but may have a different thickness in another embodiment.

Additionally, a step difference compensation film may be disposed between one or more of the second lower members 700 and the first lower member 600. For example, the step difference compensation film may be disposed in an area overlapping the second area 100A2 of the display panel 100. One surface of the step difference compensation film may have an adhesion less than an adhesion of the other surface of the step difference compensation film. In one embodiment, the aforementioned one surface may not have adhesion and/or may face the first lower member 600.

Each of the second lower members 700 may include a lower support unit 710, a heat dissipation sheet 720, and an insulating film 730. One or more of the above-mentioned components may be omitted, and one or more other components may be added to the second lower members 700.

In one embodiment, a plurality of lower support units 710 may be provided. One lower support unit of the lower support units 710 may be disposed to overlap the first area 1000A1 and a portion of the second area 1000A2, and the other lower support unit of the lower support units 710 may be disposed to overlap the third area 1000A3 and the other portion of the second area 1000A2.

The lower support units 710 may be disposed to be spaced apart from each other in the second area 1000A2. In one embodiment, the lower support units 710 may be disposed as close as possible to each other to support the area where the pattern hole 610PH of the support unit 610 is formed. The lower support units 710 may, for example, prevent the area where the pattern hole 610PH of the support unit 610 is formed from being deformed due to a pressure applied thereto from the above of the lower support units 710. In addition, the lower support units 710 may prevent the components on the second lower members 700 from being deformed due to the components under the second lower members 700.

Each of the lower support units 710 may include, for example, a metal alloy. e.g., a copper alloy. The material constituting the lower support units 710 may be different in another embodiment. Each of the lower support units 710 may have a thickness from about 60 micrometers to about 100 micrometers (e.g., about 80 micrometers), but may have a different thickness in another embodiment.

The heat dissipation sheet 720 may be attached to a lower portion of the lower support unit 710 and may serve as a heat conductive sheet having a predetermined high thermal conductivity. In one embodiment, the heat dissipation sheet 720 may include a heat dissipation layer 721, a first heat dissipation adhesive layer 722, a second heat dissipation adhesive layer 723, and a gap tape 724.

The gap tape 724 may be attached to the first heat dissipation adhesive layer 722 and the second heat dissipation adhesive layer 723, which may be spaced apart from the first heat dissipation adhesive layer 722, with the heat dissipation layer 721 therebetween. The gap tape 724 may include one or more layers. For example, gap tape 724 may include a base layer, an upper adhesive layer disposed on an upper surface of the base layer, and a lower adhesive layer disposed on a lower surface of the base layer.

The heat dissipation layer 721 may be attached to the lower support unit 710 by the first heat dissipation adhesive layer 722 and may be sealed by the first heat dissipation adhesive layer 722, the second heat dissipation adhesive layer 723, and the gap tape 724. The heat dissipation layer 721 may be, for example, a graphitized polymer film. The polymer film may be, for example, a polyimide film. Each of the first heat dissipation adhesive layer 722 and the second heat dissipation adhesive layer 723 may have a thickness from about 3 micrometers to about 8 micrometers, e.g., about 5 micrometers. Each of the heat dissipation layer 721 and the gap tape 724 may have a thickness from about 10 micrometers to about 25 micrometers, e.g., about 17 micrometers. However, the thickness of the first heat dissipation adhesive layer 722, the second heat dissipation adhesive layer 723, the heat dissipation layer 721, and/or the gap tape 724 may be different in another embodiment.

The insulating film 730 may be attached to a lower portion of the heat dissipation sheet 720. For example, the insulating film 730 may be attached to the second heat dissipation adhesive layer 723. The insulating film 730 may prevent a rattle from being generated in the electronic device 1000. The insulating film 730 may have a thickness of about 15 micrometers, but may have a different thickness in another embodiment.

The step difference compensation member 800 may be attached to a lower portion of the support unit 610. For example, the lower adhesive layer 620 may be attached to an area of the lower portion of the support unit 610, and the step difference compensation member 800 may be attached to the other area of the lower portion of the support unit 610.

The step difference compensation member 800 may include a first compensation adhesive layer 810, a step difference compensation film 820, and a second compensation adhesive layer 830. The first compensation adhesive layer 810 may be attached to a lower surface of the support unit 610, and the step difference compensation film 820 may include, for example, a synthetic resin film. The second compensation adhesive layer 830 may be attached to a lower surface of the step difference film 820 and a set. Each of the first compensation adhesive layer 810 and the second compensation adhesive layer 830 may have a thickness from about 13 micrometers to about 25 micrometers, e.g., about 17 micrometers. The thickness of each of the first compensation adhesive layer 810 and/or the second compensation adhesive layer 830 may be different in another embodiment. In one embodiment, the thickness of the step difference compensation film 820 may be determined based on the thickness of each of the first compensation adhesive layer 810 and the second compensation adhesive layer 830.

Figure 3:
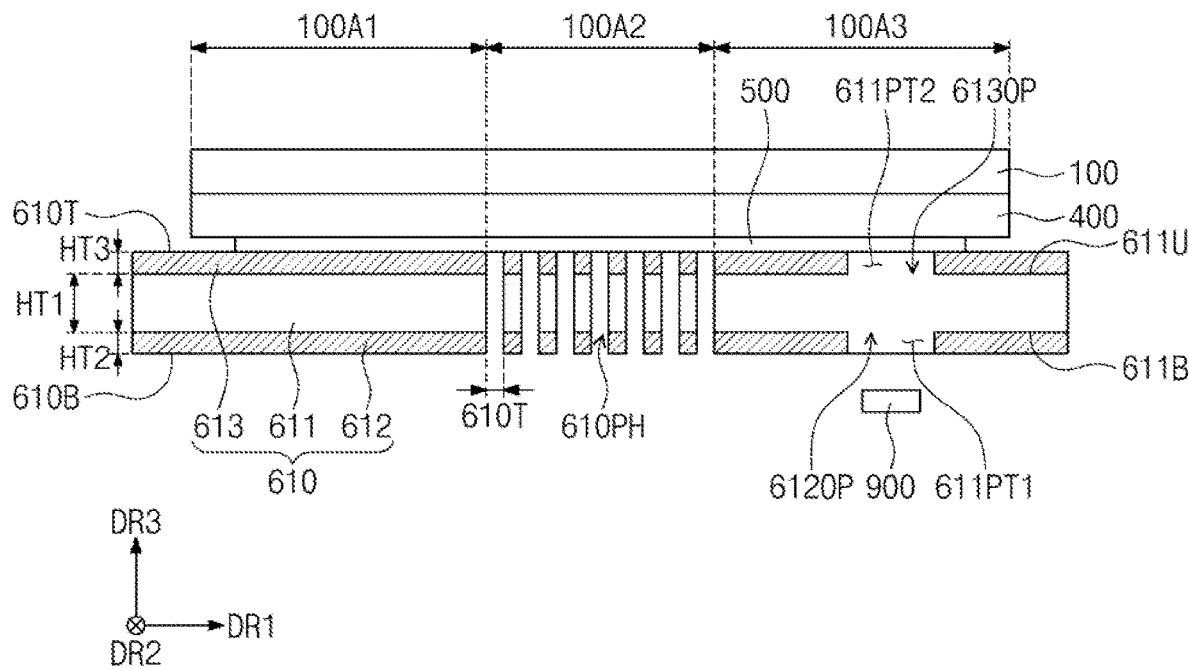
FIG. 3 illustrates an embodiment of an electronic device.

FIG. 3 is a cross-sectional view showing an embodiment of the electronic device. In FIG. 3, the same reference numerals are used to denote the same elements in FIG. 2A.

Referring to FIG. 3, the lower protective film 400 may be disposed under the display panel 100. The cushion member 500 may be disposed under the lower protective film 400. The support unit 610 may be disposed under the cushion member 500.

The support unit 610 may be disposed under the first area 100A1, the second area 100A2, and the third area 100A3. In one embodiment, the support unit 610 may have a continuous shape. The support unit 610 may include a first surface 610T defined therein and a second surface 610B defined therein that faces the first surface 610T. The display panel 100 may face the first surface 610T of the support unit 610.

The support unit 610 may include a first support unit 611, a second support unit 612, and a third support unit 613. The first support unit 611 may be disposed between the second support unit 612 and the third support unit 613, and may include a first surface 611T defined therein and a second surface 611B defined therein to face the first surface 611T.

In one embodiment, the first support unit 611 may include the fiber reinforced plastic. The fiber reinforced plastic may have, for example, a weight less than that of each of a metal or a metal alloy. Accordingly, electronic device 1000 (e.g., refer to FIG. 2A) may have reduced weight when compared with the weight of an electronic device which includes a support unit that contains only a metal or a metal alloy.

Examples of the fiber reinforced plastic of the first support unit 611 include, for example, a carbon fiber reinforced plastic (CFRP), a glass fiber reinforced plastic (GFRP), or an aramid fiber reinforced plastic (AFRP). In one embodiment, the first support unit 611 may include a fiber reinforced plastic having a woven shape.

The first support unit 611 may have a first thickness HT1, which, for example, may be in a range from about 20 micrometers to about 300 micrometers. The first thickness HT1 may be in a different range in another embodiment.

The second support unit 612 may be spaced apart from the display panel 100, with the first support unit 611 interposed therebetween. The second support unit 612 may be disposed under the first support unit 611 and on a second surface 611B of the first support unit 611. For example, the second support unit 612 may be disposed directly on the second surface 611B of the first support unit 611. The second support unit 612 may be in contact with the first support unit 611. The first support unit 611 and the second support unit 612 may be coupled to each other, for example, through a thermocompression process. The coupling relationship between the first support unit 611 and the second support unit 612 may be established using another process in a different embodiment. For example, the first support unit 611 and the second support unit 612 may be coupled to each other by a separate adhesive member.

According to one embodiment, the second support unit 612 may cover the second surface 611B of the first support unit 611. The second support unit 612 may prevent a crack from occurring in the first support unit 611 when the display panel 100 is folded.

The second support unit 612 may include, for example, a metal or a metal alloy. The metal or metal alloy may have a conductivity and thermal conductivity greater than those of fiber reinforced plastic. Accordingly, the electronic device 1000 (e.g., refer to FIG. 2A) may have improved conductivity and thermal conductivity compared with an electronic device which includes a support unit that does not contain metal or metal alloy. The second support unit 612 may include, for example, a stainless steel, a stainless alloy, a titanium alloy, or an aluminum alloy, or may include another material.

The second support unit 612 may have a second thickness HT2, which, for example, lies in a range from about 10 micrometers to about 100 micrometers. The second thickness HT2 may lie in a different range in another embodiment. In one embodiment, the second thickness HT2 may be equal to or less than the first thickness HT1.

The third support unit 613 may be spaced apart from the second support unit 612, with the first support unit 611 interposed therebetween. The third support unit 613 may be disposed on the first support unit 611 and on a first surface 611T of the first support unit 611. For example, the third support unit 613 may be disposed directly on the first surface 611T of the first support unit 611. The third support unit 613 may be in contact with the first support unit 611. The first support unit 611 and the third support unit 613 may be coupled to each other, for example, through a thermocompression process. The coupling relationship between the first support unit 611 and the third support unit 613 may be established using a different process in another embodiment. For example, the first support unit 611 and the third support unit 613 may be coupled to each other by a separate adhesive member.

The third support unit 613 may include, for example, the same material as that of the second support unit 612, e.g., the third support unit 613 may include a metal or a metal alloy.

According to the present embodiment, the metal or the metal alloy may have a conductivity and a thermal conductivity greater than those of the fiber reinforced plastic. Accordingly, the electronic device 1000 (e.g., refer to FIG. 2A) may have improved conductivity and thermal conductivity compared with an electronic device that includes a support unit that does not contain metal or metal alloy. The third support unit 613 may include, for example, a stainless steel, a stainless alloy, a titanium alloy, an aluminum alloy, or another metal or material.

The second support unit 612 and the third support unit 613 may have a predetermined high conductivity and, in one embodiment, may be used as a ground electrode. For example, the second support unit 612 and the third support unit 613 may be used as a ground electrode of the electronic device 1000 (e.g., refer to FIG. 2A).

The third support unit 613 may have a third thickness HT3, which, for example, may be in a range from about 10 micrometers to about 100 micrometers. The third thickness HT3 may be in a different range in another embodiment. Also, the third thickness HT3 may be, for example, equal to or less than the first thickness HT1. In one embodiment, the third thickness HT3 may be substantially the same as the second thickness HT2.

Each of the first support unit 611, the second support unit 612, and the third support unit 613 may be provided with the pattern hole 610PH defined therethrough. The pattern hole 610PH may overlap the second area 100A2 of the display panel 100 and may extend in the third direction DR3 from the second surface 610B. In one embodiment, the pattern hole 610PH may be formed to penetrate through the first support unit 611, the second support unit 612, and the third support unit 613 in the third direction DR3. The pattern hole 610PH may be formed, for example, by a laser cut processing method, a water jet processing method, or a mold press-cut processing method.

The pattern hole 610PH may have a pattern width 610T, which, for example, may be in a range from about 100 micrometers to about 200 micrometers (e.g., about 150 micrometers) or may be in another range.

The second support unit 612 may be provided with a first opening 6120P defined therethrough to overlap the electronic module 900. The third support unit 613 may be provided with a second opening 6130P to overlap the electronic module 900.

The first support unit 611 may include a first protruding portion 611PT1 and a second protruding portion 611PT2. The first protruding portion 611PT1 may be disposed in the first opening 6120P. The second protruding portion 611PT2 may be disposed in the second opening 6130P. As the first support unit 611, the second support unit 612, and the third support unit 613 are coupled to each other (e.g., by a thermocompression process), the first protruding portion 611PT1 and the second protruding portion 611PT2 may be formed in the first support unit 611 to protrude to the first opening 6120P and the second opening 6130P.

The electronic module 900 may face the second surface 610B of the support unit 610 and may be disposed under the support unit 610. The electronic module 900 may be spaced apart from the display panel 100, with the support unit 610 interposed therebetween. The electronic module 900 may overlap the first area 100A1 or the third are 100A3 of the display panel 100.

The electronic module 900 may be, for example, a fingerprint recognition sensor, a gyro sensor, an antenna, or another type of sensor or electronic circuit. The electronic module 900 may overlap the first opening 6120P and the second opening 6130P. Accordingly, the electronic module 900 may not overlap the second support unit 612 and the third support unit 613, which contain the metal or the metal alloy. Thus, electrical interference may be prevented from occurring between the electronic module 900 and the second and third support units 612 and 613. Due to the first opening 6120P and the second opening 6130P respectively defined through the second support unit 612 and the third support unit 613, the probability of a malfunction of the electronic module 900 may be reduced. Accordingly, reliability of the electronic module 900 may be improved.

In one case, the support unit 610 may have a single-layer structure. In this case, the support unit 610 may include only fiber reinforced plastic, metal, or metal alloy. When the support unit includes only the fiber reinforced plastic, the conductivity and the thermal conductivity of the support unit may be reduced. When the support unit includes only metal or metal alloy, the weight of the support unit may increase which, in turn, may increase the total weight of the electronic device.

However, according to at least one embodiment, the support unit 610 may include a plurality of layers that include different materials. For example, the support unit 610 may include the first support unit 611, the second support unit 612, and the third support unit 613. The weight of the support unit 610 including the plurality of layers may be less than the weight of the support unit having the single-layer structure due to the first support unit 611 including fiber reinforced plastic. Also, the strength of the support unit 610 and conductivity and thermal conductively of the support unit 610 may be improved due to the second support unit 612 and the third support unit 613, which contain metal or metal alloy. Accordingly, heat dissipation performance of the support unit 610 may be improved.

Figure 4:
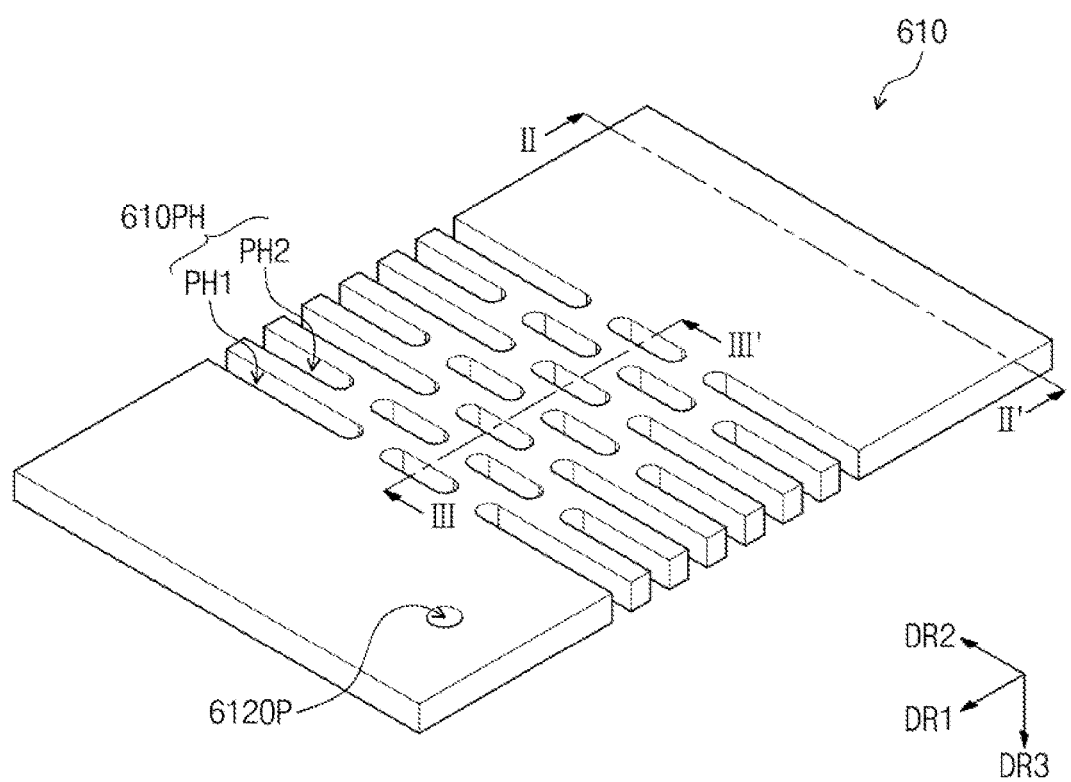
FIG. 4 illustrates an embodiment of a support unit.

FIG. 4 is a perspective view showing the support unit 610 according to an exemplary embodiment. In FIG. 4, the same reference numerals denote the same elements in FIG. 3.

Referring to FIG. 4, in one embodiment a plurality of pattern holes 610PH may be provided, including a plurality of first holes PH1 and a plurality of second holes PH2. The first holes PH1 may extend in the second direction DR2 and may be spaced apart from each other in the second direction DR2. The second holes PH2 may be spaced apart from the first holes PH1 in the first direction DR1 and may extend in the second direction DR2, and the second holes PH2 may be spaced apart from each other in the second direction DR2. The first holes PH1 and the second holes PH2 may be alternately defined with each other in the first direction DR1. When viewed in a plane, the first holes PH1 and the second holes PH2 may be arranged in a predetermined pattern. In one embodiment, the predetermined pattern may include a zigzag shape along the second direction DR2.

Figure 5A:
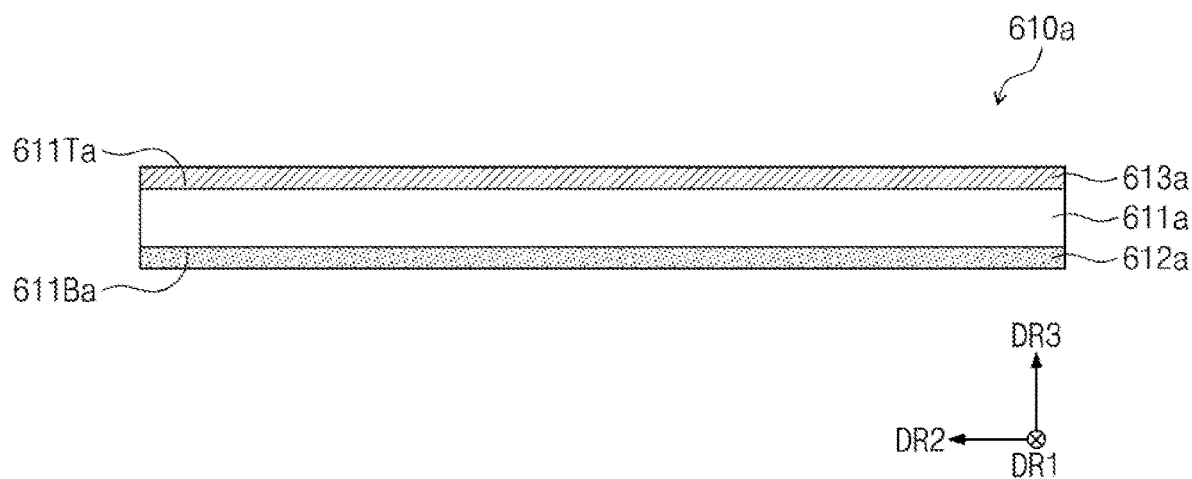
FIGS. 5A to 5H illustrate views taken along a line II-IF of FIG. 4.

FIG. 5A is a cross-sectional view taken along a line II-II' of FIG. 4 according to an exemplary embodiment.

Referring to FIGS. 2A, 3, and 5A, a support unit 610a may include a first support unit 611a, a second support unit 612a, and a third support unit 613a. The first support unit 611a may be disposed between the second support unit 612a and the third support unit 613a, and may include a first surface 611Ta and a second surface 611Ba facing the first surface 611Ta. The first support unit 611a may include a predetermined material, e.g., fiber reinforced plastic. In one embodiment, the weight of the fiber reinforced plastic may be less than the weight of each of the metal and the metal alloy. Accordingly, the electronic device 1000 may have reduced weight compared with an electronic device that includes a support unit containing only the metal or the metal alloy.

The second support unit 612a may be spaced apart from the display panel 100, with the first support unit 611a interposed therebetween. The second support unit 612a may be disposed between the first support unit 611a and the electronic module 900. In one embodiment, the second support unit 612a may be disposed on the second surface 611Ba of the first support unit 611a, e.g., the second support unit 612a may be disposed directly on the second surface 611Ba of the first support unit 611a. Thus, in this embodiment, the second support unit 612a may be in contact with the first support unit 611a. In one embodiment, the second support unit 612a may be disposed indirectly on the first support unit 611a. The first support unit 611a and the second support unit 612a may be coupled to each other through one or more predetermined processes, an example of which is a thermocompression process.

The second support unit 612a may include a plastic film. According to the present embodiment, the weight of the plastic film may be less than the weight of each of the metal and the metal alloy. Accordingly, the electronic device 1000 may have reduced weight when compared with an electronic device including a support unit that contains only metal or metal alloy. In addition, the plastic film may be disposed on the electronic module 900 to prevent electrical interference from occurring between the conductive material and electronic module 900. Accordingly, reliability of the electronic module 900 may be improved. In addition, the plastic film may be easily folded compared with metal or metal alloy. Thus, the electronic device 1000 may easily be folded compared with an electronic device including a support unit that contains only metal or metal alloy. The second support unit 612a may include materials including, but not limited to, epoxy, polyimide, polypropylene, polyamide, or polyethylene terephthalate.

The third support unit 613a may be spaced apart from the second support unit 612a, with the first support unit 611a interposed therebetween. The third support unit 613a may be disposed on the first support unit 611a. In one embodiment, the third support unit 613a may be disposed on the first surface 611Ta of the first support unit 611a. For example, the third support unit 613a may be disposed directly on the first surface 611Ta of the first support unit 611a, e.g., the third support unit 613a may be in contact with the first support unit 611a. In one embodiment, the third support unit 613a may be indirectly disposed on the first surface 611Ta of the first support unit 611a. The first support unit 611a and the third support unit 613a may be coupled to each other through one or more processes, an example of which includes a thermocompression process.

The third support unit 613a may include metal or metal alloy and may include a material different from that of the second support unit 612a. According to the present embodiment, the metal or metal alloy may have a conductivity and a thermal conductivity greater than those of fiber reinforced plastic. Accordingly, electronic device 1000 may have improved conductivity and thermal conductivity when compared with an electronic device including a support unit that does not include metal or metal alloy.

Figure 5B:
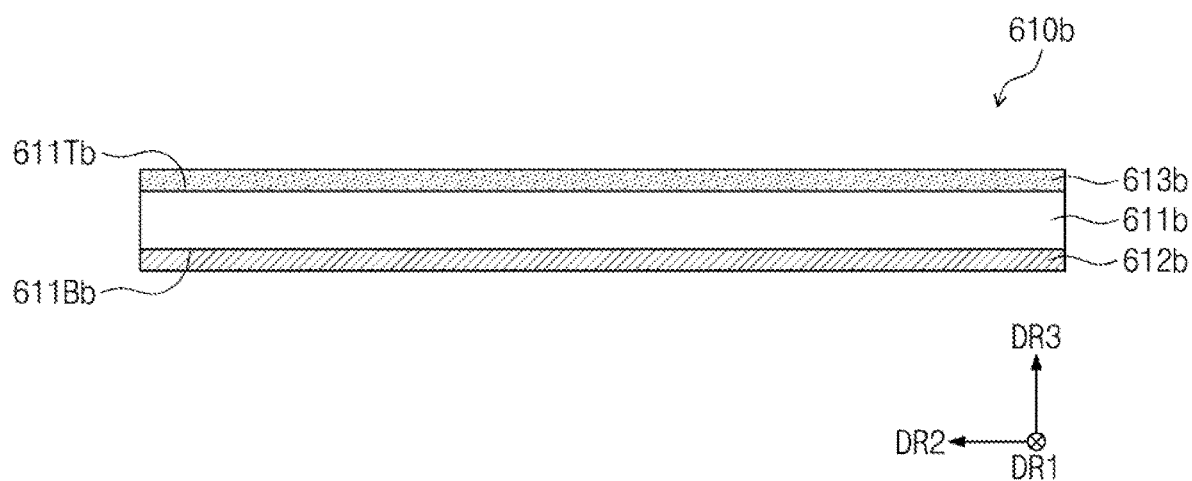

FIG. 5B is a cross-sectional view taken along a line II-II' of FIG. 4 according to an exemplary embodiment.

Referring to FIGS. 2A, 3, and 5B, a support unit 610b may include a first support unit 611b, a second support unit 612b, and a third support unit 613b. The first support unit 611b may be disposed between the second support unit 612b and the third support unit 613b. The first support unit 611b includes a first surface 611Tb and a second surface 611Bb facing the first surface 611Tb. The first support unit 611b may include fiber reinforced plastic. According to the present embodiment, the weight of the fiber reinforced plastic may be less than the weight of each of the metal and the metal alloy. Accordingly, the electronic device 1000 may have reduced weight compared with an electronic device including a support unit that contains only the metal or the metal alloy.

The second support unit 612b may be spaced apart from the display panel 100, with the first support unit 611b interposed therebetween. The second support unit 612b may be disposed on the electronic module 900 and under the first support unit 611b. The second support unit 612b may be disposed on the second surface 611Bb of the first support unit 611b. For example, the second support unit 612b may be disposed directly on the second surface 611Bb of the first support unit 611b, e.g., the second support unit 612b may be in contact with the first support unit 611b. In one embodiment, the second support unit 612b may be indirectly disposed on the second surface 611Bb of the first support unit 611b. The first support unit 611b and the second support unit 612b may be coupled to each other through one or more processes, an example of which includes a thermocompression process.

The second support unit 612b may include metal or metal alloy. According to the present embodiment, the metal or metal alloy may have greater conductivity and thermal conductivity than those of fiber reinforced plastic. Accordingly, electronic device 1000 may have improved conductivity and thermal conductivity compared with the electronic device including a support unit that does not contain the metal or the metal alloy.

The third support unit 613b may be spaced apart from the second support unit 612b, with the first support unit 611b interposed therebetween. The third support unit 613b may be disposed on the first support unit 611b. The third support unit 613b may be disposed on the first surface 611Tb of the first support unit 611b. For example, the third support unit 613b may be disposed directly on the first surface 611Tb of the first support unit 611b, e.g., the third support unit 613b may be in contact with the first support unit 611b. In one embodiment, the third support unit 613b may be indirectly disposed on the first surface 611Tb of the first support unit 611b. The first support unit 611b and third support unit 613b may be coupled to each other through one or more processes, an example of which includes a thermocompression process.

The third support unit 613b may include a plastic film. According to the present embodiment, the weight of the plastic film may be less than the weight of each of the metal and metal alloy. Accordingly, electronic device 1000 may have reduced weight compared with an electronic device including a support unit that contains only metal or metal alloy.

Figure 5C:
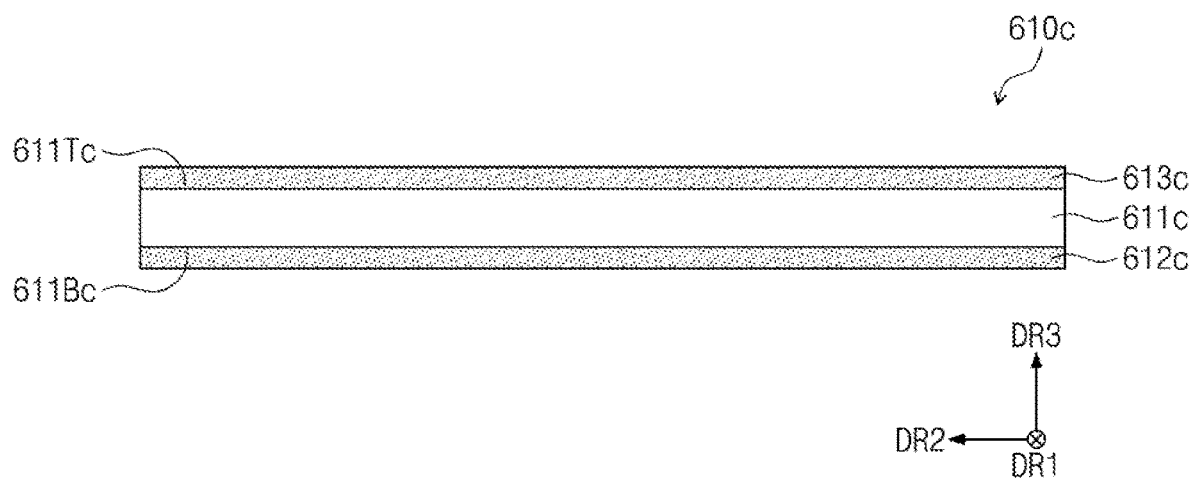

FIG. 5C is a cross-sectional view taken along a line II-II' of FIG. 4 according to an exemplary embodiment.

Referring to FIGS. 2A, 3, and 5C, a support unit 610c may include a first support unit 611c, a second support unit 612c, and a third support unit 613c. The first support unit 611c may be disposed between the second support unit 612c and the third support unit 613c. The first support unit 611c may include a first surface 611Tc and a second surface 611Bc facing the first surface 611Tc.

The first support unit 611c may include fiber reinforced plastic. According to the present embodiment, the weight of the fiber reinforced plastic may be less than the weight of each of the metal and metal alloy. Thus, electronic device 1000 may have reduced weight compared with an electronic device with a support unit that contains only metal or metal alloy.

The second support unit 612c may be spaced apart from the display panel 100, with the first support unit 611c interposed therebetween. The second support unit 612c may be disposed on the electronic module 900 and under the first support unit 611c. The second support unit 612c may be disposed on the second surface 611Bc of the first support unit 611c. For example, the second support unit 612c may be disposed directly on the second surface 611Bc of the first support unit 611c, e.g., the second support unit 612c may be in contact with the first support unit 611c. In one embodiment, the second support unit 612c may be indirectly disposed on the second surface 611Bc of the first support unit 611c. The first support unit 611c and the second support unit 612c may be coupled to each other through one or more processes, e.g., an example of which includes a thermocompression process.

The second support unit 612c may include plastic film. According to the present embodiment, the weight of the plastic film may be less than the weight of each of the metal and metal alloy. Accordingly, electronic device 1000 may have reduced weight compared with an electronic device including a support unit that contains only metal or metal alloy. In addition, the plastic film may be disposed on the electronic module 900 to prevent electrical interference from occurring between the conductive material and electronic module 900. Accordingly, reliability of the electronic module 900 may be improved. In addition, the plastic film may be easily folded compared with metal or metal alloy. Accordingly, electronic device 1000 may be easily folded compared with an electronic device including a support unit that contains only metal or metal alloy.

The third support unit 613c may be spaced apart from the second support unit 612c, with the first support unit 611c interposed therebetween. The third support unit 613c may be disposed on the first support unit 611c and on the first surface 611Tc of the first support unit 611c. For example, the third support unit 613c may be disposed directly on the first surface 611Tc of the first support unit 611c, e.g., the third support unit 613c may be in contact with the first support unit 611c. In one embodiment, the third support unit 613c may be indirectly disposed on the first surface 611Tc of the first support unit 611c. The first support unit 611c and the third support unit 613c may be coupled to each other through one or more processes, an example of which includes a thermocompression process.

In one embodiment, the third support unit 613c may include the same material as that of the second support unit 612c. For example, the third support unit 613c may include a plastic film. According to the present embodiment, the weight of the plastic film may be less than the weight of the metal or the metal alloy. Accordingly, electronic device 1000 may have reduced weight compared with an electronic device including a support unit that contains only metal or metal alloy.

Figure 5D:
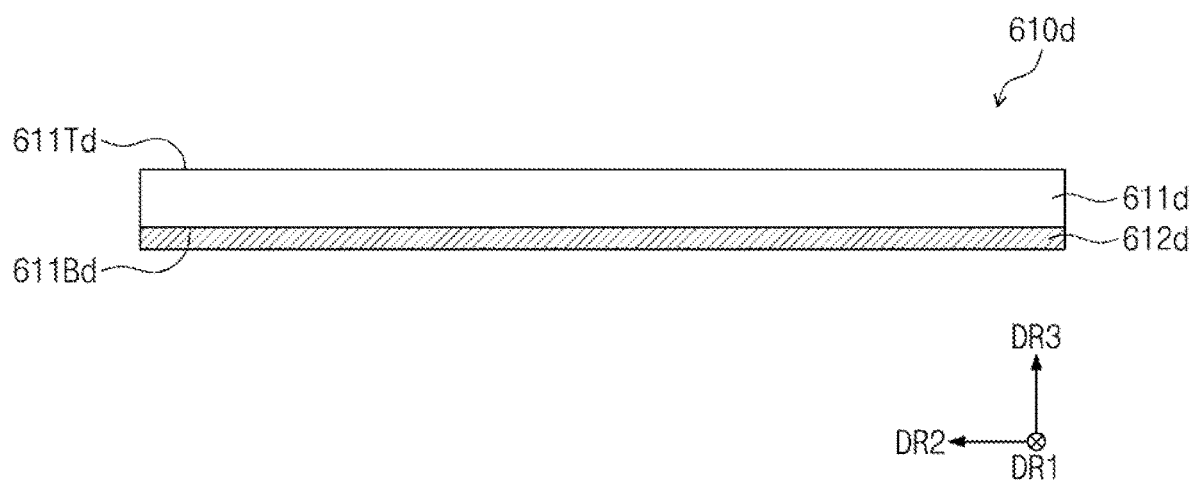

FIG. 5D is a cross-sectional view taken along a line II-II' of FIG. 4 according to an exemplary embodiment.

Referring to FIGS. 2A, 3, and 5D, a support unit 610d may include a first support unit 611d and a second support unit 612d. The first support unit 611d may include a first surface 611Td and a second surface 611Bd facing the first surface 611Td. The first support unit 611d may include fiber reinforced plastic. According to the present embodiment, the weight of the fiber reinforced plastic may be less than the weight of each of the metal and the metal alloy. Accordingly, electronic device 1000 may have reduced weight compared with an electronic device including a support unit that contains only metal or metal alloy.

The second support unit 612d may be spaced apart from the display panel 100, with the first support unit 611d interposed therebetween. The second support unit 612d may be disposed on the electronic module 900 and under the first support unit 611d. The second support unit 612d may be disposed on the second surface 611Bd of the first support unit 611d. For example, the second support unit 612d may be disposed directly on the second surface 611Bd of the first support unit 611d, e.g., the second support unit 612d may be in contact with the first support unit 611d. In one embodiment, the second support unit 612d may be indirectly disposed on the second surface 611Bd of the first support unit 611d. The first support unit 611d and the second support unit 612d may be coupled to each other through one or more processes, an example of which includes a thermocompression process.

The second support unit 612d may include metal or metal alloy. According to the present embodiment, the metal or metal alloy may have greater conductivity and thermal conductivity than those of fiber reinforced plastic. Accordingly, electronic device 1000 may have improved conductivity and thermal conductivity compared with an electronic device including a support unit that does not contain metal or metal alloy.

Figure 5E:
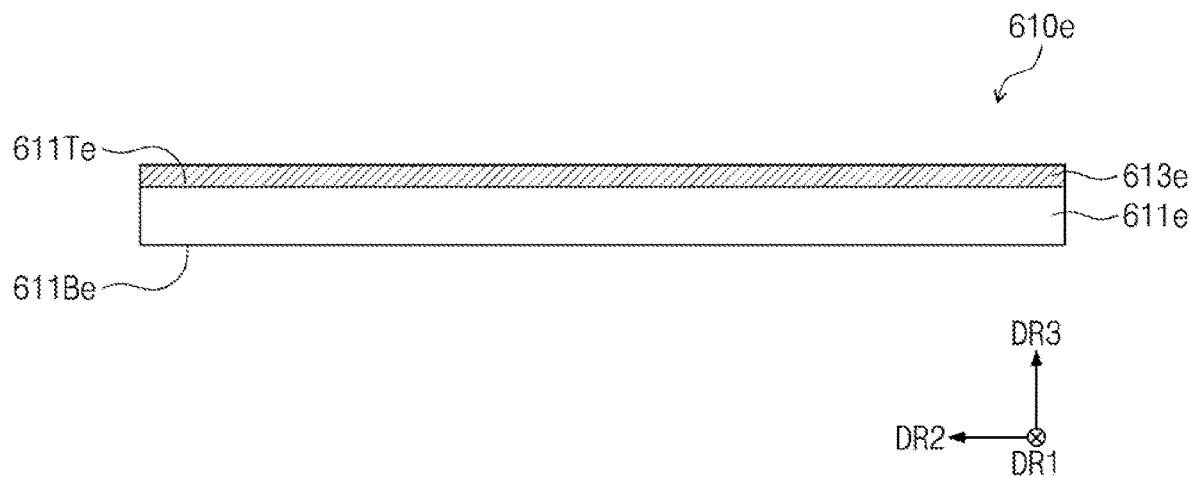

FIG. 5E is a cross-sectional view taken along a line II-II' of FIG. 4 according to an exemplary embodiment.

Referring to FIGS. 2A, 3, and 5E, a support unit 610e may include a first support unit 611e and a third support unit 613e. The first support unit 611e may include a first surface 611Te and a second surface 611Be facing the first surface 611Te. The first support unit 611e may include fiber reinforced plastic. According to the present embodiment, the weight of the fiber reinforced plastic may be less than the weight of each of the metal and metal alloy. Accordingly, electronic device 1000 may have reduced weight compared with an electronic device including a support unit that contains only metal or metal alloy.

The third support unit 613e may be disposed on the first support unit 611e. For example, the third support unit 613e may be disposed on the first surface 611Te of the first support unit 611e. In one embodiment, the third support unit 613e may be disposed directly on the first surface 611Te of the first support unit 611e, e.g., the third support unit 613e may be in contact with the first support unit 611e. In one embodiment, the third support unit 613e may be indirectly disposed on the first surface 611Te of the first support unit 611e. The first support unit 611e and the third support unit 613e may be coupled to each other through one or more processes, an example of which includes a thermocompression process.

The third support unit 613e may include metal or metal alloy. According to the present embodiment, the metal or the metal alloy may have greater conductivity and thermal conductivity than those of fiber reinforced plastic. Accordingly, electronic device 1000 may have improved conductivity and thermal conductivity compared with an electronic device including a support unit that does not contain metal or metal alloy.

Figure 5F:

FIG. 5F is a cross-sectional view taken along a line II-IF of FIG. 4 according to an exemplary embodiment.

Referring to FIGS. 2A, 3, and 5F, a support unit 610f may include a first support unit 611f and a third support unit 613f

The first support unit 611f may include a first surface 611Tf and a second surface 611Bf facing the first surface 611Tf. The first support unit 611f may include fiber reinforced plastic. According to the present embodiment, the weight of the fiber reinforced plastic may be less than the weight of each of the metal and metal alloy. Accordingly, electronic device 1000 may have reduced weight compared with an electronic device including a support unit that contains only metal or metal alloy.

The third support unit 613f may be disposed on the first support unit 611f and on the first surface 611Tf of the first support unit 611f For example, the third support unit 613f may be disposed directly on the first surface 611Tf of the first support unit 611f, e.g., the third support unit 613f may be in contact with the first support unit 611f In one embodiment, the third support unit 613f may be indirectly disposed on the first surface 611Tf of the first support unit 611f The first support unit 611f and third support unit 613f may be coupled to each other through one or more processes, an example of which includes a thermocompression process.

The third support unit 613f may include plastic film. According to the present embodiment, the weight of the plastic film may be less than that of each of the metal and metal alloy. Accordingly, electronic device 1000 may have reduced weight compared with an electronic device including a support unit that contains only metal or metal alloy.

Figure 5G:
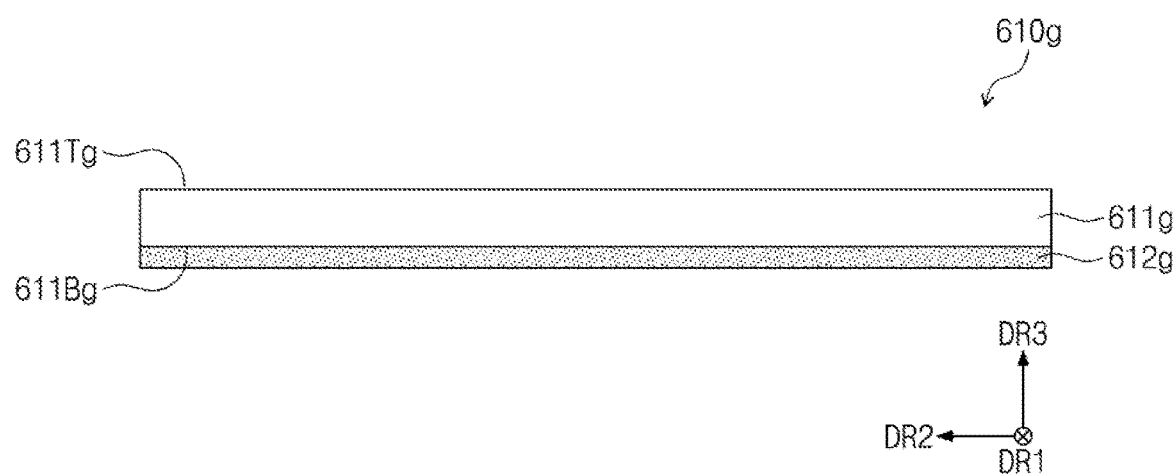

FIG. 5G is a cross-sectional view taken along a line II-II' of FIG. 4 according to an exemplary embodiment.

Referring to FIGS. 2A, 3, and 5G, a support unit 610g may include a first support unit 611g and a second support unit 612g. The first support unit 611g may include a first surface 611Tg and a second surface 611Bg facing the first surface 611Tg. The first support unit 611g may include fiber reinforced plastic. According to the present embodiment, the weight of the fiber reinforced plastic may be less than the weight of each of metal and metal alloy. Accordingly, electronic device 1000 may have reduced weight compared with an electronic device including a support unit that contains only metal or metal alloy.

The second support unit 612g may be spaced apart from the display panel 100, with the first support unit 611g interposed therebetween. The second support unit 612g may be disposed on the electronic module 900 and under the first support unit 611g. The second support unit 612g may be disposed on the second surface 611Bg of the first support unit 611g. For example, the second support unit 612g may be disposed directly on the second surface 611Bg of the first support unit 611g, e.g., the second support unit 612g may be in contact with the first support unit 611g. In one embodiment, the second support unit 612g may be indirectly disposed on the second surface 611Bg of the first support unit 611g. The first support unit 611g and the second support unit 612g may be coupled to each other through one or more processes, an example of which includes a thermocompression process.

The second support unit 613g may include plastic film. According to the present embodiment, the weight of the plastic film may be less than that of each of the metal or metal alloy. Accordingly, electronic device 1000 may have reduced weight compared with an electronic device including a support unit that contains only metal or metal alloy.

Figure 5H:
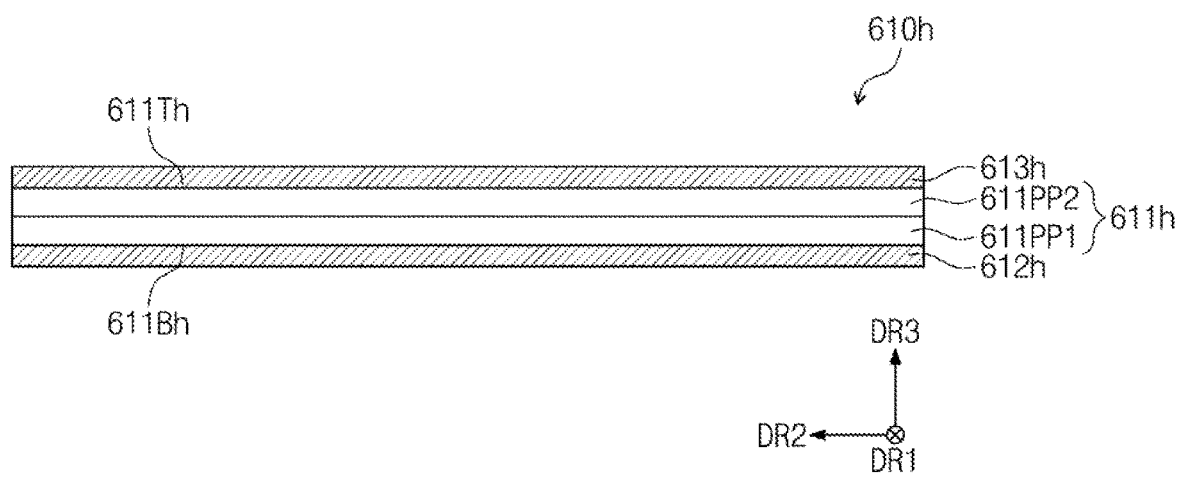

FIG. 5H is a cross-sectional view taken along a line II-II' of FIG. 4 according to an exemplary embodiment.

Referring to FIG. 5H, a support unit 610h may include a first support unit 611h, a second support unit 612h, and a third support unit 613h. The first support unit 611h may be disposed between the second support unit 612h and the third support unit 613h. The first support unit 611h may include a first surface 611Th and a second surface 611Bh facing the first surface 611Th.

Additionally, the first support unit 611h may include a first sub-support unit 611PP1 and a second sub-support unit 611PP2. The first sub-support unit 611PP1 may include first fibers extending in the first direction DR1 and spaced apart from each other in the second direction DR2. The second sub-support unit 611PP2 may be disposed on the first sub-support unit 611PP1 and may include second fibers extending in the second direction DR2 and spaced apart from each other in the first direction DR1.

The first support unit 611h may include fiber reinforced plastic. The first sub-support unit 611PP1 and the second sub-support unit 611PP2 of the first support unit 611h may be manufactured by, for example, using a prepreg method. The first sub-support unit 611PP1 and the second sub-support unit 611PP2 may be coupled to each other, for example, through a thermocompression process. According to the present embodiment, the weight of the fiber reinforced plastic may be less than that of each of the metal or metal alloy. Accordingly, electronic device 1000 may have reduced weight compared with an electronic device including a support unit that contains only metal or metal alloy.

The second support unit 612h may be spaced apart from the display panel 100, with the first support unit 611h interposed therebetween. The second support unit 612h may be disposed on the electronic module 900 and under the first support unit 611h. The second support unit 612h may be disposed on the second surface 611Bh of the first support unit 611h. For example, the second support unit 612h may be disposed directly on the second surface 611Bh of the first support unit 611h, e.g., the second support unit 612h may be in contact with the first support unit 611h. In one embodiment, the second support unit 612h may be indirectly disposed on the second surface 611Bh of the first support unit 611h. The first support unit 611h and the second support unit 612h may be coupled to each other through one or more processes, and example of which includes a thermocompression process.

The second support unit 612h may include metal or metal alloy. According to the present embodiment, the metal or metal alloy may have greater conductivity and thermal conductivity than those of fiber reinforced plastic. Accordingly, electronic device 1000 may have improved conductivity and thermal conductivity compared with an electronic device including a support unit that does not contain metal or metal alloy.

The third support unit 613h may be spaced apart from the second support unit 612h, with the first support unit 611h interposed therebetween. The third support unit 613h may be disposed on the first support unit 611h and on the first surface 611Th of the first support unit 611h. For example, the third support unit 613h may be disposed directly on the first surface 611Th of the first support unit 611h, e.g., the third support unit 613h may be in contact with the first support unit 611h. In one embodiment, the third support unit 613h may be disposed directly on the first surface 611Th of the first support unit 611h. The first support unit 611h and the third support unit 613h may be coupled to each other through one or more processes, an example of which includes a thermocompression process. In one embodiment, the third support unit 613h may include substantially the same material as that of the second support unit 612h, although may have a different material in another embodiment.

Figure 6A:
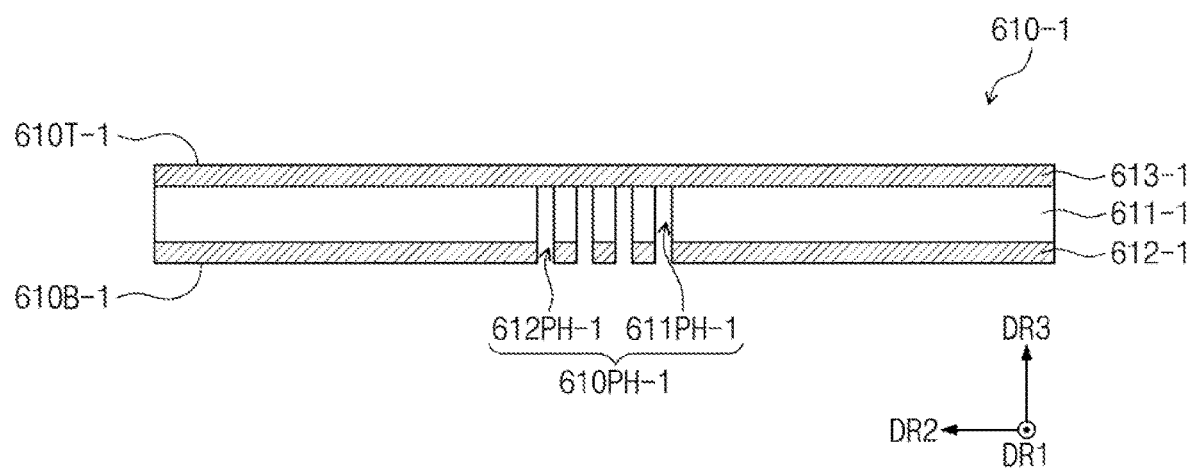
FIGS. 6A to 6F illustrate views taken along a line of FIG. 4.

FIG. 6A is a cross-sectional view taken along a line of FIG. 4 according to an exemplary embodiment. Referring to FIGS. 2A, 3, and 6A, a support unit 610-1 may include a first surface 610T-1 and a second surface 610B-1 facing the first surface 610T-1.

The support unit 610-1 may include a first support unit 611-1, a second support unit 612-1, and a third support unit 613-1. The support unit 610-1 may include a pattern hole 610PH-1 in an area, for example, overlapping the second area 100A2 of the display panel 100. The pattern hole 610PH-1 may extend in the third direction DR3 from the second surface 610B-1. The pattern hole 610PH-1 may include a first pattern hole 611PH-1 and a second pattern hole 612PH-1. The first pattern hole 611PH-1 may be defined in the first support unit 611-1. The second pattern hole 612PH-1 may be defined in the second support unit 612-1.

According to the present embodiment, a shape of the portion of the support unit 610-1 may be easily changed due to the pattern hole 610PH-1. Accordingly, a folding operation of electronic device 1000 may be easily performed due to the pattern hole 610PH-1. In addition, according to the present embodiment, a pattern hole may not be defined in the third support unit 613-1. Accordingly, foreign substances may be prevented from entering the display panel 100 through the pattern hole 610PH-1.

Figure 6B:
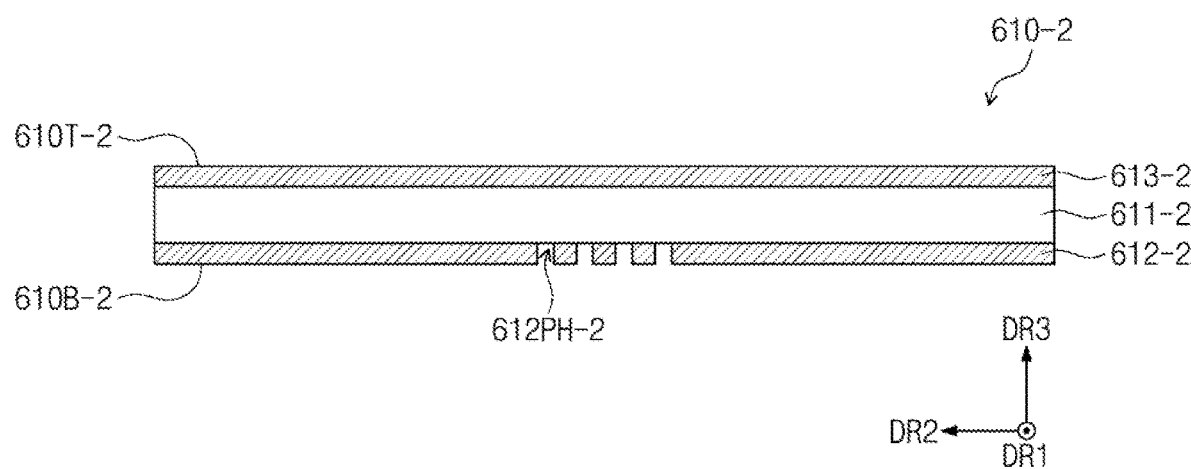

FIG. 6B is a cross-sectional view taken along a line of FIG. 4 according to an exemplary embodiment. Referring to FIGS. 2A, 3, and 6B, a support unit 610-2 may include a first surface 610T-2 and a second surface 610B-2 facing the first surface 610T-2.

The support unit 610-2 may include a first support unit 611-2, a second support unit 612-2, and a third support unit 613-2. The second support unit 612-2 may include a second pattern hole 612PH-2 in an area, for example, overlapping the second area 100A2 of the display panel 100. According to the present embodiment, a shape of a portion of support unit 610-2 may be easily changed due to the second pattern hole 612PH-2. Accordingly, a folding operation of electronic device 1000 may be easily performed due to the second pattern hole 612PH-2. In addition, according to the present embodiment, the pattern hole may not be in the first support unit 611-2 and the third support unit 613-2. Accordingly, foreign substances may be prevented from entering the display panel 100 through the second pattern hole 612PH-2.

Figure 6C:
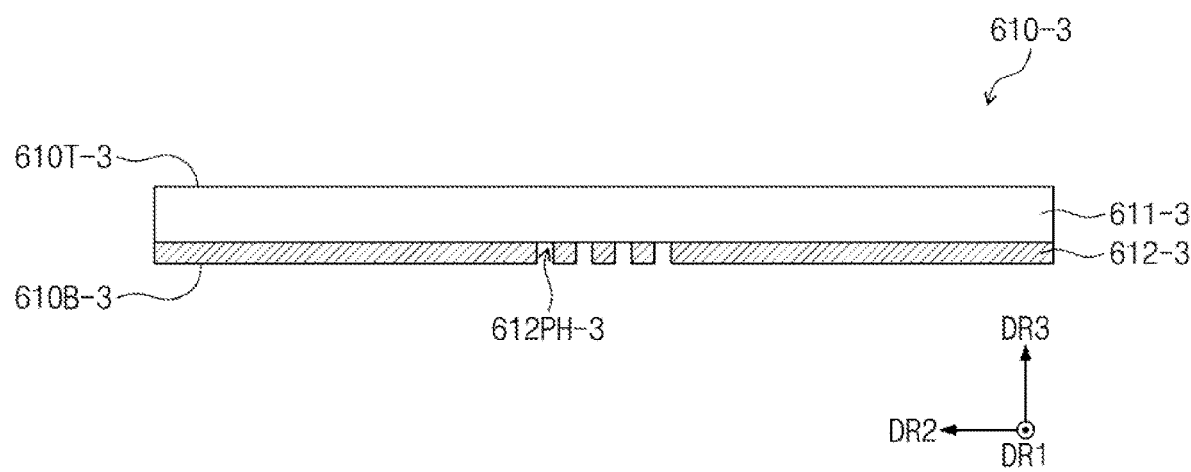

FIG. 6C is a cross-sectional view taken along a line of FIG. 4 according to an exemplary embodiment. Referring to FIGS. 2, 3, and 6C, a support unit 610-3 may include a first surface 610T-3 and a second surface 610B-3 facing the first surface 610T-3.

The support unit 610-3 may include a first support unit 611-3 and a second support unit 612-3. The second support unit 612-3 may include a second pattern hole 612PH-3 in an area, for example, overlapping the second area 100A2 of the display panel 100. The second pattern hole 612PH-3 may extend in the third direction DR3 from the second surface 610B-3. According to the present embodiment, a shape of a portion of the support unit 610-3 may be easily changed due to the second pattern hole 612PH-3. Accordingly, a folding operation of electronic device 1000 may be easily performed due to the second pattern hole 612PH-3. In addition, according to the present embodiment, the pattern hole may not be defined in the first support unit 611-3. Accordingly, a foreign substance may be prevented from entering the display panel 100 through the second pattern hole 612PH-3.

Figure 6D:
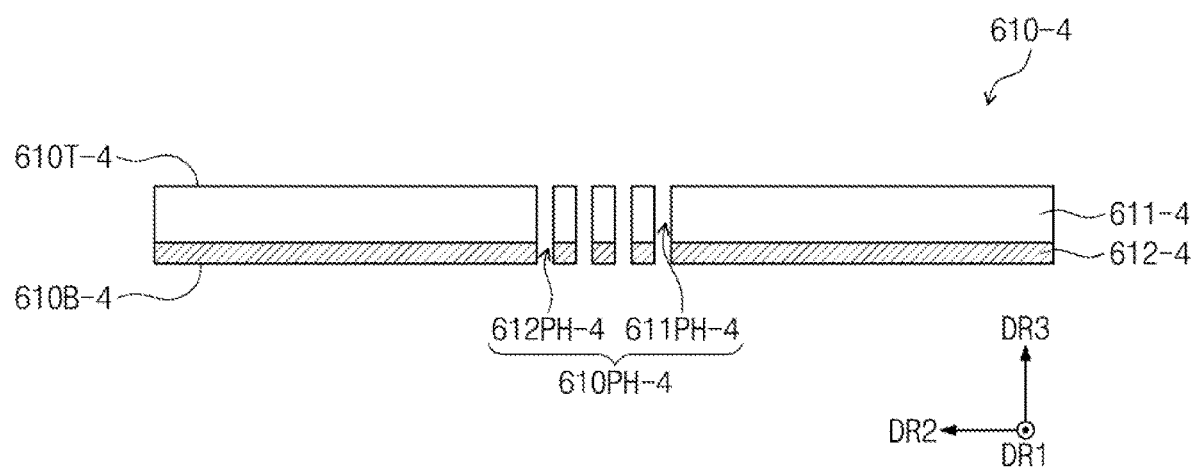

FIG. 6D is a cross-sectional view taken along a line of FIG. 4 according to an exemplary embodiment. Referring to FIGS. 2A, 3, and 6D, a support unit 610-4 may include a first surface 610T-4 and a second surface 610B-4 facing the first surface 610T-4.

The support unit 610-4 may include a first support unit 611-4 and a second support unit 612-4. The support unit 610-4 may include a pattern hole 610PH-4 in an area, for example, overlapping the second area 100A2 of the display panel 100. The pattern hole 610PH-4 may extend in the third direction DR3 from the second surface 610B-4.

The pattern hole 610PH-4 may include a first pattern hole 611PH-4 and a second pattern hole 612PH-4. The first pattern hole 611PH-4 may pass through the first support unit 611-4. The second pattern hole 612PH-4 may be pass through the second support unit 612-4.

According to the present embodiment, a shape of a portion of the support unit 610-4 may be easily changed due to the pattern hole 610PH-4. Accordingly, a folding operation of electronic device 1000 may be easily performed due to the pattern hole 610PH-4.

Figure 6E:
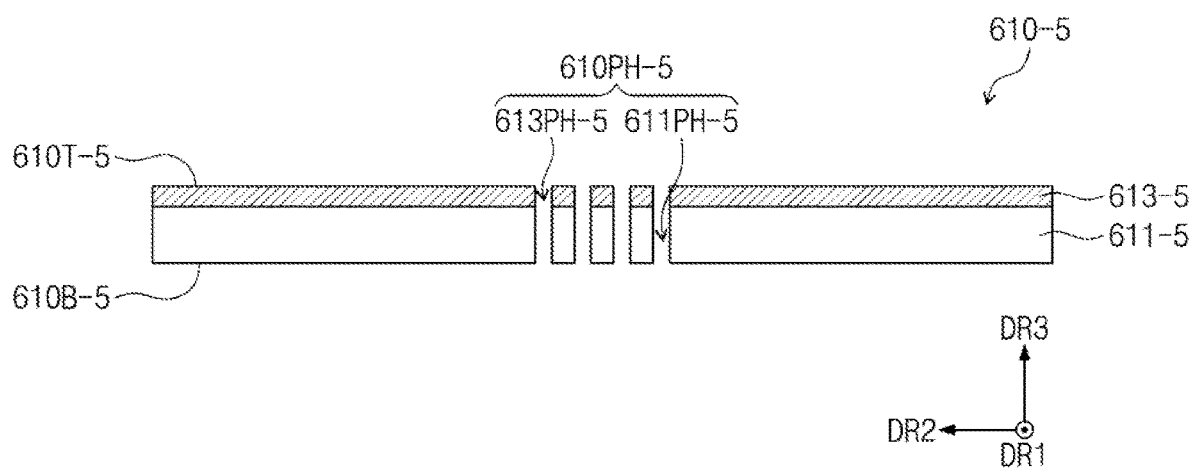

FIG. 6E is a cross-sectional view taken along a line of FIG. 4 according to an exemplary embodiment. Referring to FIGS. 2A, 3, and 6E, a support unit 610-5 may include a first surface 610T-5 and a second surface 610B-5 facing the first surface 610T-5.

The support unit 610-5 may include a first support unit 611-5 and a third support unit 613-5. The support unit 610-5 may include a pattern hole 610PH-5 in an area, for example, overlapping the second area 100A2 of the display panel 100. The pattern hole 610PH-5 may extend in the third direction DR3 from the second surface 610B-5.

The pattern hole 610PH-5 may include a first pattern hole 611PH-5 and a third pattern hole 613PH-5. The first pattern hole 611PH-5 may pass through the first support unit 611-5. The third pattern hole 613PH-5 may pass through the third support unit 613-5.

According to the present embodiment, a shape of a portion of the support unit 610-5 may be easily changed due to the pattern hole 610PH-5. Accordingly, a folding operation of electronic device 1000 may be easily performed due to the pattern hole 610PH-5.

Figure 6F:
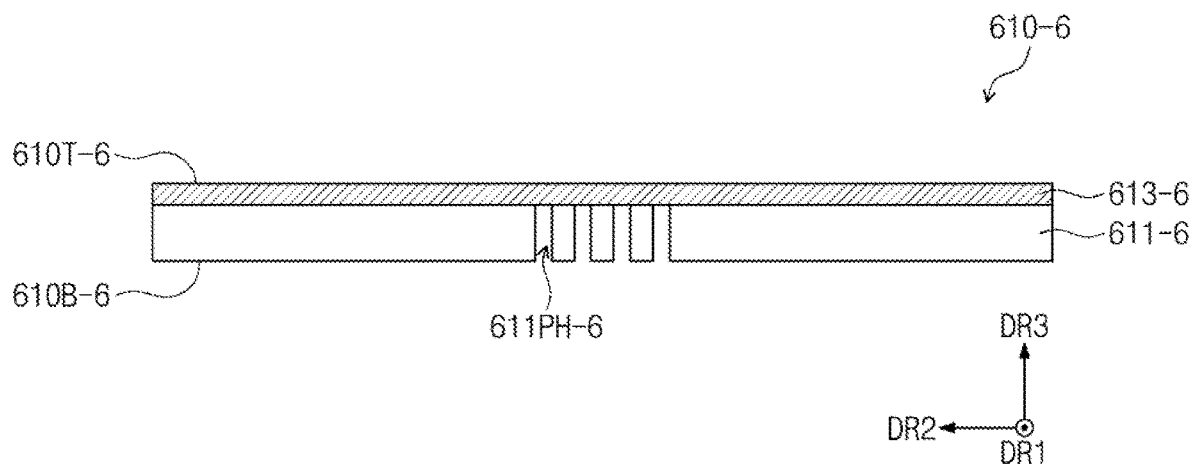

FIG. 6F is a cross-sectional view taken along a line of FIG. 4 according to an exemplary embodiment. Referring to FIGS. 2A, 3, and 6F, a support unit 610-6 may include a first surface 610T-6 and a second surface 610B-6 facing the first surface 610T-6.

The support unit 610-6 may include a first support unit 611-6 and a third support unit 613-6. The first support unit 611-6 may include a first pattern hole 611PH-6 in an area, for example, overlapping the second area 100A2 of the display panel 100. The first pattern hole 611PH-6 may extend in the third direction DR3 from the second surface 610B-6.

According to the present embodiment, a shape of a portion of the support unit 610-6 may be easily changed due to the first pattern hole 611PH-6. Accordingly, a folding operation of electronic device 1000 may be easily performed due to the first pattern hole 611PH-6. In addition, according to the present embodiment, the pattern hole may not extend into the third support unit 613-6. Accordingly, foreign substances may be prevented from entering the display panel 100 through the first pattern hole 611PH-6.

In accordance with one embodiment, an apparatus for an electronic device includes a support coupled to a display panel of the electronic device. The support includes a first support layer including a first material and a second support layer coupled to the first support and including a second material. The first material includes a metal or a metal alloy, and the second material includes plastic. Additionally, a total weight of the second support layer is less than a total weight of the first support layer. The support and support layers may correspond to any of the aforementioned embodiments as described herein and shown in the drawings. As indicated in these embodiments, the plastic material may be implemented, for example, as fiber reinforced plastic or plastic film, or in another implementation that includes plastic.

Although the exemplary embodiments of the present disclosure have been described, it is understood that the present disclosure should not be limited to these exemplary embodiments but various changes and modifications can be made by one ordinary skilled in the art within the spirit and scope of the present disclosure as hereinafter claimed. Therefore, the disclosed subject matter should not be limited to any single embodiment described herein, and the scope of the present inventive concept shall be determined according to the attached claims. The embodiments may be combined to form additional embodiments.

What is claimed is:

1. An electronic device, comprising:
    a display panel comprising a first area, a second area adjacent to the first area in a first direction, and a third area spaced apart from the first area in the first direction, the second area interposed between the first area and the third area;
    a support disposed under the display panel; and
    an electronic module spaced apart from the display panel with the support interposed therebetween and overlapping the third area, the support comprising:
        a first support comprising a first surface and a second surface facing the first surface; and
        a second support disposed on the first surface of the first support, wherein the second support includes a first opening overlapping the electronic module, and wherein the first support comprises a protruding portion, and the protruding portion is disposed in the first opening.

2. The electronic device of claim 1, wherein the support is disposed under the first area, the second area, and the third area and has a continuous shape.

3. The electronic device of claim 1, wherein the second support is in contact with the first support.

4. The electronic device of claim 1, wherein the first support comprises fiber reinforced plastic.

5. The electronic device of claim 1, wherein a thickness of the first support is greater than a thickness of the second support.

6. The electronic device of claim 5, wherein:
    the support comprises a third support disposed on the second surface and spaced apart from the second support, and
    the first support is interposed between the second support and the third support.

7. The electronic device of claim 6, wherein the second support and the third support comprise different materials.

8. The electronic device of claim 6, wherein the second support comprises a metal or a metal alloy.

9. The electronic device of claim 8, wherein:
    the third support comprises the metal or the metal alloy, and
    the third support includes a second opening therethrough which overlaps the electronic module.

10. The electronic device of claim 5, wherein the support includes a pattern hole passing through at least a portion thereof in a thickness direction and in an area overlapping the second area.

11. The electronic device of claim 10, wherein:
    the support comprises an upper surface facing the display panel and a lower surface facing the upper surface, and
    the pattern hole extends from the lower surface.

12. The electronic device of claim 5, wherein the second support is disposed between the display panel and the first support.

13. The electronic device of claim 5, wherein:
    the second support is spaced apart from the display panel, and
    the first support is between the display panel and the second support.

14. An electronic device, comprising:
    a display panel comprising a folding area and a non-folding area, the folding area configured to fold about a folding axis and the non-folding area adjacent to the folding area;
    a support disposed under the display panel; and
    an electronic module spaced apart from the display panel with the support interposed therebetween, wherein the support comprises:
        a first support comprising a first surface and a second surface facing the first surface; and
        a second support disposed on the first surface of the first support, wherein the second support includes a first opening therethrough and overlapping the non-folding area, the first support comprising a protruding portion disposed in the first opening and the first opening overlaps the electronic module.

15. The electronic device of claim 14, wherein:
    the first support comprises fiber reinforced plastic, and
    the second support comprises metal or metal alloy.

16. The electronic device of claim 14, wherein the support includes a pattern hole passing through at least a portion thereof in a thickness direction and in an area overlapping the folding area.

17. The electronic device of claim 14, wherein:
    the support comprises a third support disposed on the second surface and spaced apart from the second support, and
    the first support is between the second support and the third support.

18. The electronic device of claim 17, wherein the second support and the third support comprise different materials.

19. The electronic device of claim 17, wherein the second support and the third support comprise a same material.

* * * * *